(12) United States Patent
Maget et al.

(10) Patent No.: US 7,592,875 B2
(45) Date of Patent: Sep. 22, 2009

(54) INJECTION-LOCKED OSCILLATOR CIRCUIT

(75) Inventors: Judith Maget, Taufkirchen (DE); Marc Tiebout, München (DE)

(73) Assignee: Infineon Technologies AG, Munich (DE)

( * ) Notice: Subject to any disclaimer, the term of this patent is extended or adjusted under 35 U.S.C. 154(b) by 123 days.

(21) Appl. No.: 10/574,151

(22) PCT Filed: Sep. 10, 2004

(86) PCT No.: PCT/DE2004/002023

§ 371 (c)(1),
(2), (4) Date: Feb. 6, 2007

(87) PCT Pub. No.: WO2005/041402

PCT Pub. Date: May 6, 2005

(65) Prior Publication Data

US 2008/0030282 A1  Feb. 7, 2008

(30) Foreign Application Priority Data

Sep. 29, 2003 (DE) ................................ 103 45 195

(51) Int. Cl.
*H03K 3/03* (2006.01)
*H03B 5/12* (2006.01)
(52) U.S. Cl. .................... 331/46; 331/117 FE; 331/167
(58) Field of Classification Search .................... 331/2, 331/45–47, 117 R, 117 FE, 167
See application file for complete search history.

(56) References Cited

U.S. PATENT DOCUMENTS

| 6,175,285 | B1 |  | 1/2001 | Gabara |
| 6,198,360 | B1 |  | 3/2001 | Henrion |
| 6,232,847 | B1 | * | 5/2001 | Marcy et al. ................. 331/167 |
| 6,417,740 | B1 | * | 7/2002 | Anh et al. ..................... 331/48 |
| 6,617,936 | B2 |  | 9/2003 | Dally et al. |
| 6,850,122 | B2 | * | 2/2005 | Ravi et al. .................... 331/46 |
| 2004/0008092 | A1 | * | 1/2004 | Hajimiri et al. ......... 331/117 R |
| 2004/0263262 | A1 | * | 12/2004 | Ravi et al. .................... 331/46 |
| 2008/0129399 | A1 | * | 6/2008 | Jang et al. .............. 331/117 FE |

OTHER PUBLICATIONS

Craninckx, J. et al., "Wireless CMOS Frequency Synthesizer Design," Kluwer Academic Publishers, pp. iv-247 (1998).
"The Design of Low Noise Oxcillators"; A. Hajimiri, T.H. Lee; Kluwer, Boston (1999); ISBN 0-7923-8455-5.

(Continued)

*Primary Examiner*—Vibol Tan
*Assistant Examiner*—Jason Crawford
(74) *Attorney, Agent, or Firm*—Dicke, Billig & Czaja, P.L.L.C.

(57) ABSTRACT

An ILO circuit has a plurality of oscillator stages which are coupled to one another by means of a "tank lock" coupling. The coupling leads to an improved synchronization of the individual oscillator stages and thus to a reduced phase noise. Any desired LC oscillator topology can be used, not just the topology with PMOS and NMOS transistors. It is also possible to use SOI transistors, that is to say transistors formed on an SOI substrate. The bulk terminals of the transistors may be coupled not only to a supply voltage but, for example, also to a center potential, a reference voltage source, to ground, in floating fashion and/or to the source terminal.

19 Claims, 17 Drawing Sheets

OTHER PUBLICATIONS

"A 900-MHz CMOS LC Oscillator with Quadrature Outputs"; A. Rofourgaran et al.; IEEE Int. Solid-State Circuits Conf. (ISSC); Dig. Tech. Papers (Feb. 1996); pp. 392-393.

"Analysis and Design of a 1.8 GHz CMOS LC Quadrature VCO"; P. Andreani et al.; Journal of Solid State Circuits vol. 37 No. 12 (Dec. 2002) pp. 1737-1747.

"A 1.8 GHz CMOS Quadtrature Voltage Controlled Oscillator (VCO) Using the Constant Current LC Ring Oscillator Structure"; C.J. Wu, H.S. Kao; International Symposium on Circuits and Systems (1998) pp. 378-381.

"Low Power, Low-Phase-Noise differentially tuned Quadrature VCO Design in Standard CMOS"; Tiebout M., Journal of Solid State Circuits, vol. 36, No. 7, (Jul. 2001) pp. 1018-1024.

"Single-Chip 900 MHz Spread-Spectrum Wireless Transceiver in 1-μm CMOS-Part I: Architecture and Transmitter Design", A. Rofourgaran et al.; Journal of Solid State Circuits, vol. 33, No. 4, (Apr. 1998) pp. 515-534.

"A Low-Phase-Noise CMOS LC Oscillator with a Ring structure", J.J. Kim and B. Kim; International Solid State Circuits Conference, vol. XLIII (Feb. 2000) p. 430.

* cited by examiner

PRIOR ART

PRIOR ART

INJECTION-LOCKED OSCILLATOR CIRCUIT

CROSS REFERENCE TO RELATED APPLICATION

This Utility Patent Application claims the benefit of the filing date of Application Number DE 103 45 195.1, filed Sep. 29, 2003 and International Application No. PCT/DE2004/002023, filed Sep. 10, 2004, all of which are herein incorporated by reference.

BACKGROUND

The invention relates to an injection-locked oscillator circuit.

Quadrature signals are used for I/Q modulation and I/Q demodulation in various applications. I/Q modulation is understood to mean that one component of the wave is "in phase" and a second component of the wave is a "quadrature" component, that is to say has a 90° phase shift with respect to the first component. I/Q modulation is an efficient way of transmitting, modulating and demodulating phase and amplitude information.

By way of example, I/Q modulation and I/Q demodulation are applied in "wireless applications", that is to say for example in GSM mobile radio. In "wireline applications" as well, for example in the case of "Uniphy", signals having four clock phases are used in order to multiply sample an input signal and in order to detect the data. The systems which use I/Q (de)modulation require in each case a signal, also called system clock, having a phase angle of 0°, that is to say the system clock which is "in phase", and a system clock having a phase angle of 90°, that is to say the system clock which represents the quadrature signal.

So-called oscillator circuits, also referred to hereinafter as oscillator stage, are used for generating the system clocks. If such an oscillator circuit is used as a so-called local oscillator, it has to fulfill very stringent specifications with regard to the phase noise proceeding from it for specific applications, for example GSM mobile radio. The temporal variation of the spacings between two zero crossings, the so-called jitter, of the oscillations proceeding from the oscillator circuit, and that is to say of the system clocks, may also be regarded as equivalent to the phase noise.

Oscillator circuits are often embodied as so-called voltage controlled oscillators or VCOs.

If an oscillator circuit is used as a local oscillator for the frequency translation of a signal to be transmitted, that is to say of the information to be transmitted, then noise in the system clock of the local oscillator leads to the "dispersal" of the transmitted signal, that is to say to a deterioration in the transmission quality of the signal. As a result of this dispersal, on the one hand it becomes more difficult to unambiguously detect the transmitted signal at the receiver end, and on the other hand the further processing of the received signal is made more difficult, if not even prevented "Wireless CMOS Frequency Synthesizer Design"; J. Craninckx, M. Steyaert; Kluwer, Boston (1998); ISBN 0-7923-8138-0. It should be noted that phase noise specifications, that is to say limit values for phase noise which have to be complied with during a transmission of a signal, are application-specific. By way of example, the phase noise specifications in the case of mobile radio emerge inter alia from the spacings between adjacent frequency channels and—within the individual frequency channels—the minimum transmission power to be detected, or the maximum permitted interference power.

For cost reasons and with the aim of simultaneous integrability of analog and digital functions on one chip, the VCOs are intended to be formed in fully integrated fashion as LC oscillators "Wireless CMOS Frequency Synthesizer Design"; J. Craninckx, M. Steyaert; Kluwer, Boston (1998); ISBN 0-7923-8138-0, "The Design of Low Noise Oscillators"; A. Hajimiri, T. H. Lee; Kluwer, Boston (1999); ISBN 0-7923-8455-5 using a CMOS technology.

A CMOS LC oscillator with quadrature signal outputs in accordance with the prior art is described in "A 900-MHz CMOS LC Oscillator with Quadrature Outputs"; A. Rofourgaran et al.; IEEE Int. Solid-State Circuits Conf. (ISSCC); Dig. Tech. Papers (February 1996); pp. 392-393. The CMOS LC oscillator described in "A 900-MHz CMOS LC Oscillator with Quadrature Outputs"; A. Rofourgaran et al.; IEEE Int. Solid-State Circuits Conf. (ISSCC); Dig. Tech. Papers (February 1996); pp. 392-393 is suitable in principle for generating I/Q signals, that is to say clock signals or system clocks having a phase angle of 0° and 90°. The device described therein has a first oscillator subcircuit and a second oscillator subcircuit. The two oscillator subcircuits are coupled by means of a transistor subcircuit comprising a total of eight transistors coupled to one another.

FIG. 10 illustrates a basic circuit diagram of a differential voltage controlled oscillator comprising cross-coupled NMOS and PMOS transistors without a current source (usually a current source is often added), which may be regarded as a basis of the considerations below containing VCOs in accordance with the prior art. The VCO 1000 illustrated in FIG. 10 has an inductance 1001, which is coupled at its two ends to respectively a first node 1002 and a second node 1003. The first node 1002 is coupled to a third node 1004, which is coupled to a first output terminal 1005 of the VCO. Furthermore, the third node 1004 is coupled to a fourth node 1006. The fourth node 1006 is coupled to a first terminal of a first varactor 1007, that is to say a variable capacitance. A second terminal of the first varactor 1007 is coupled to a fifth node 1008. The fifth node 1008 is coupled to a first terminal of a second varactor 1009. Furthermore, the fifth node 1008 is coupled to a voltage source 1010, which provides a voltage serving for setting the variable capacitances of the varactors 1007 and 1009. A second terminal of the second varactor 1009 is coupled to a sixth node 1011, which sixth node 1011 is coupled to a seventh node 1012. The seventh node 1012 is coupled to a second output terminal 1013 of the VCO. Furthermore, the seventh node 1012 is coupled to the second node 1003. The two varactors 1007 and 1009 may also be formed as an individual varactor.

Above-described elements of FIG. 10 form an LC element 1014 of the VCO. Furthermore, the VCO also has a first so-called oscillator transistor subcircuit 1015 and a second oscillator transistor subcircuit 1016. The two transistor subcircuits each have two transistors cross-connected up to one another.

The first output terminal 1005 and the second output terminal 1013 represent the output terminals of the VCO, at which the output signals of the VCO are made available, the output signals being phase-shifted by 180° relative to one another.

In detail, the second oscillator transistor subcircuit 1016 from FIG. 10 is embodied as follows.

The fourth node 1006 is coupled to an eighth node 1017. The eighth node 1017 is coupled to a first source/drain terminal 1018 of a first transistor 1019. The second source/drain terminal 1020 of the first transistor 1019 is coupled to a ninth node 1021. The ninth node 1021 is coupled to a voltage source 1022, which provides the reference voltage for the VCO. The gate terminal 1023 of the first transistor 1019 is coupled to a tenth node 1024. The ninth node 1021 is furthermore coupled to a first source/drain terminal 1025 of a second transistor 1026. The second source/drain terminal 1027 of the second transistor 1026 is coupled to the tenth node 1024 and the gate terminal 1028 of the second transistor 1026 is coupled to the eighth node 1017. Furthermore, the tenth node 1024 is coupled to the sixth node 1011.

In detail, the first oscillator transistor subcircuit 1015 from FIG. 10 is embodied as follows.

The first node 1002 is coupled to an eleventh node 1040. The eleventh node 1040 is coupled to a first source/drain terminal 1029 of a third transistor 1030. The second source/drain terminal 1031 of the third transistor 1030 is coupled to a twelfth node 1032. The twelfth node 1032 is coupled to a voltage source 1033, which provides the supply voltage for the VCO. The gate terminal 1034 of the third transistor 1030 is coupled to a thirteenth node 1035. The twelfth node 1032 is furthermore coupled to a first source/drain terminal 1036 of a fourth transistor 1037. The second source/drain terminal 1038 of the fourth transistor 1037 is coupled to the thirteenth node 1035 and the gate terminal 1039 of the fourth transistor 1037 is coupled to the eleventh node 1040. Furthermore, the thirteenth node 1035 is coupled to the second node 1003.

In FIG. 10, the four transistors each additionally have a bulk terminal, the bulk terminal of the first transistor 1019 and the bulk terminal of the second transistor 1026 being coupled to the reference voltage source 1022, whereas the bulk terminal of the third transistor 1030 and the bulk terminal of the fourth transistor 1037 are coupled to the supply voltage source 1033.

Various types of couplings of a plurality of VCOs to form a so-called oscillator ring are known in the prior art, and are described briefly below. The individual VCOs of an oscillator ring are also referred to as oscillator stages. FIG. 11 symbolically illustrates an individual oscillator stage.

In the symbolic illustration, an individual oscillator stage 1100 has a first voltage supply terminal 1101, via which a supply voltage is made available to the oscillator stage 1100. Furthermore, the oscillator stage 1100 has a second voltage supply terminal 1102, via which the oscillator stage 1100 is supplied with a tuning voltage for varactors provided in the oscillator stage 1100. The oscillator stage 1100 furthermore has a third voltage supply terminal 1103, via which the oscillator stage 1100 is supplied with a reference voltage. Furthermore, the oscillator stage 1100 has two coupling inputs 1104 and 1105, which serve for making two input signals available to the oscillator stage 1100. In this case, the two input signals have a relative phase shift of 180° with respect to one another. The oscillator stage 1100 furthermore has two coupling outputs 1106 and 1107, which serve for coupling out two output signals of the oscillator stage 1100. In this case, the two output signals have a relative phase shift of 180° with respect to one another.

The coupling of a plurality of such oscillator stages is illustrated schematically in FIG. 12. In this case, the tuning voltage, reference voltage and supply voltage are identical for all the oscillator stages and the coupling of the individual voltage sources is not illustrated in FIG. 12.

In FIG. 12, three oscillator stages 1100a, 1100b and 1100c as illustrated in FIG. 11 are schematically coupled to one another. It should furthermore be noted that the individual oscillator stages, in addition to an individual so-called cross-coupling are coupled among one another by means of so-called direct couplings, that is to say that the output signal having a phase angle of 180° is applied to the input terminal having a phase angle of 180°, and the output signal having a phase angle of 0° applied to the input terminal having a phase angle of 0°. In a coupling of the individual oscillator stages, the output terminals of one oscillator stage are in each case coupled to the input terminals of the next oscillator stage.

The schematic illustration of coupled oscillator stages is described in detail below. A first output terminal 1106a of a first oscillator stage 1100a, which for example provides a signal having a phase angle of 180°, is coupled to a first input terminal 1104b of a second oscillator stage 1100b, which input terminal has a phase angle of 180°. A second output terminal 1107a of the first oscillator stage 1100a, which in the example provides a signal having a phase angle of 0°, is coupled to a second input terminal 1105b of the second oscillator stage 1100b, which input terminal has a phase angle of 0°.

Furthermore, a first output terminal 1106b of the second oscillator stage 1100b, which in the example provides a signal having a phase angle of 180°, is coupled to a first input terminal 1104c of a third oscillator stage 1100c, which input terminal has a phase angle of 180°. A second output terminal 1107b of the second oscillator stage 1100b, which in the example provides a signal having a phase angle of 0°, is coupled to a second input terminal 1105c of a third oscillator stage 1100c, which input terminal has a phase angle of 0°.

Additional oscillator stages may be coupled in the manner described previously. This is indicated in FIG. 12 by the dashed couplings illustrated between the second oscillator stage 1100b and the third oscillator stage 1100c.

The last oscillator stage, the third oscillator stage 1100c in FIG. 12, is coupled to the first oscillator stage 1100a. It should be taken into consideration in the case of this coupling that this coupling is a cross-coupling.

In detail, the coupling of the third oscillator stage 1100c to the first oscillator stage 1100a is as follows. A first output terminal 1106c of the third oscillator stage 1100c, which in the example provides a signal having a phase angle of 180°, is coupled to a second input terminal 1105a of the third oscillator stage 1100a, which input terminal has a phase angle of 0°. A second output terminal 1107c of the third oscillator stage 1100c, which in the example provides a signal having a phase angle of 0°, is coupled to a first input terminal 1104a of the first oscillator stage 1100a, which input terminal has a phase angle of 180°.

For a stable oscillation, the phase rotation along the total number of oscillator stages, that is to say along the so-called oscillator ring, must amount to a multiple of $2\pi$. It should furthermore be taken into consideration that when a plurality of oscillator stages are arranged in an oscillator ring the current consumption of the oscillator ring rises since there is an increased number of current paths between the supply voltage (Vdd) and the reference voltage (Vss). In this case, the rise in the current consumption is approximately linear with the number of oscillator stages used.

In principle, two possibilities for the realization of the coupling inputs in the individual oscillator stages are known. These are firstly the so-called serial coupling, which is described for example in "Analysis and Design of a 1.8 GHz CMOS LC Quadrature VCO"; P. Andreani et al.; Journal of Solid State Circuits vol. 37 No. 12 (December 2002) pp. 1737-1747 and "A 1.8 GHz CMOS Quadrature Voltage Controlled Oscillator (VCO) Using the Constant Current LC Ring Oscillator Structure"; C. J. Wu, H. S. Kao; International Symposium on Circuits and Systems (1998) pp. 378-381, and secondly the so-called parallel coupling, which is described for example in "Low Power, Low-Phase-Noise differentially tuned Quadrature VCO Design in Standard CMOS"; Tiebout M., Journal of Solid State Circuits, Vol. 36, No. 7, (July 2001)

pp. 1018-1024, "Single-Chip 900 MHz Spread-Spectrum Wireless Transceiver in 1-µm CMOS—Part I: Architecture and Transmitter Design", A. Rofourgaran et al.; Journal of Solid State Circuits, Vol. 33, No. 4, (April 1998) pp. 515-534 and "A Low-Phase-Noise CMOS LC Oscillator with a Ring structure", J. J. Kim and B. Kim; International Solid State Circuits Conference, Vol. XLIII (February 2000) p. 430. Both types of coupling and, in particular, the corresponding configuration of the oscillator stages are explained in more detail below.

Firstly, an oscillator basic stage for a serial coupling is described with reference to FIG. 13. An inductance 1300 is coupled to a first node 1301 at a first end. The first node 1301 is coupled to a second node 1302. The second node 1302 is coupled to a first output terminal 1303. Furthermore, the second node 1302 is coupled to a third node 1304. The third node 1304 is coupled to a fourth node 1305. The fourth node 1305 is coupled to a first source/drain terminal 1306 of a first transistor 1307. The second source/drain terminal 1308 of the first transistors coupled to a first source/drain terminal 1309 of a second transistor 1310. Furthermore, a bulk terminal 1311 of the first transistor is coupled to a reference voltage source 1312. The second source/drain terminal 1313 of the second transistor 1310 is coupled to a fifth node 1314. Furthermore, a bulk terminal 1315 is coupled to the second source/drain terminal 1313 of the second transistor 1310. The fifth node 1314 is coupled to a reference voltage source 1316. The fifth node 1314 is furthermore coupled to a first source/drain terminal 1317 of a third transistor 1318 and the first source/drain terminal 1317 of the third transistor 1318 is coupled to a bulk terminal 1319 of the third transistor 1318. The second source/drain terminal 1320 of the third transistor 1318 is coupled to a first source/drain terminal 1321 of a fourth transistor 1322. The gate terminal 1323 of the third transistor 1318 is coupled to the fourth node 1305. The second source/drain terminal 1324 of the fourth transistor 1322 is coupled to a sixth node 1325. A bulk terminal 1326 of the fourth transistor 1322 is coupled to a reference voltage source 1327. The sixth node 1325 is coupled to the gate terminal 1328 of the second transistor 1310. Furthermore, the sixth node 1325 is coupled to a seventh node 1329. The seventh node 1329 is coupled to an eighth node 1330. Furthermore, the seventh node 1329 is coupled to a first terminal of a first varactor 1331. The second terminal of the first varactor 1331 is coupled to a ninth node 1332. The ninth node 1332 is coupled to a tuning voltage source 1333. Furthermore, the ninth node 1332 is coupled to a first terminal of a second varactor 1334. The second terminal of the varactor 1334 is coupled to the third node 1304.

The tuning voltage source 1333 is used to provide a voltage for tuning the capacitance for the two varactors 1331 and 1334. The two varactors may also be formed as an individual varactor. The voltages which are provided by means of the reference voltage sources 1312, 1316 and 1327 are identical in magnitude and are also designated as Vss hereinafter and in the Figures.

The eighth node 1330 is coupled to a second output terminal 1335, which provides a signal for outputting which is phase-shifted by 180° relative to the signal present at the first output terminal 1303. The eighth node 1330 is furthermore coupled to a tenth node 1336. The tenth node 1336 is coupled to the second terminal of the inductance 1300.

The tenth node 1336 is furthermore coupled to an eleventh node 1337. The eleventh node 1337 is coupled to a first source/drain terminal 1338 of a fifth transistor 1339. The second source/drain terminal 1340 of the fifth transistor 1339 is coupled to a first source/drain terminal 1341 of a sixth transistor 1342. A bulk terminal 1343 of the fifth transistor 1339 is coupled to a first supply voltage source 1344. The second source/drain terminal 1345 of the sixth transistor 1342 is coupled to a twelfth node 1346. A bulk terminal 1347 of the sixth transistor 1342 is coupled to the second source/drain terminal 1345 of the sixth transistor 1342. The twelfth node 1346 is coupled to a second supply voltage source 1368. Furthermore, the twelfth node is coupled to a first source/drain terminal 1348 of a seventh transistor 1349. The second source/drain terminal 1350 of the seventh transistor 1349 is coupled to a first source/drain terminal 1351 of an eighth transistor 1352. A bulk terminal 1353 of the seventh transistor 1349 is coupled to the first source/drain terminal 1348 of the seventh transistor 1349. The gate terminal 1354 of the seventh transistor 1349 is coupled to the eleventh node 1337. The second source/drain terminal 1355 of the eighth transistor 1352 is coupled to a thirteenth node 1356. A bulk terminal 1357 of the eighth transistor 1352 is coupled to a third supply voltage source 1358. The thirteenth node 1356 is coupled to the first node 1301. Furthermore, the thirteenth node 1356 is coupled to the gate terminal 1359 of the sixth transistor 1342.

The voltages which are provided by means of the supply voltage sources 1344, 1347 and 1358 are identical in magnitude and are also designated as Vdd hereinafter and in the Figures.

The oscillator stage and the two differential output terminals have been described above with reference to FIG. 13. However, the oscillator stage additionally also has input terminals, which are described below.

The input terminals are formed by means of the gate terminals of the first, fourth, fifth and eighth transistors. For this purpose, the gate terminal 1360 of the first transistor 1307 is coupled to a fourteenth node 1361. The fourteenth node 1361 is coupled to the gate terminal 1362 of the eighth transistor 1352. Furthermore, the fourteenth node 1361 is coupled to a first input terminal 1363. The gate terminal 1364 of the fourth transistor 1322 is coupled to a fifteenth node 1365, which fifteenth node 1365 is coupled to the gate terminal 1366 of the fifth transistor 1339. The fifteenth node 1365 is furthermore coupled to a second input terminal 1367.

In general, the first transistor, the fourth transistor, the fifth transistor and the eighth transistor represent coupling transistors of the oscillator stage, whereas the second transistor, the third transistor, the sixth transistor and the seventh transistor represent oscillator transistors of the oscillator stage.

With reference to FIG. 13, it can also be explained more precisely what is to be understood by the direct coupling already mentioned above and the cross-coupling.

By way of example, the signal at the first output terminal 1303 of a first oscillator stage has a phase angle of 180°. In the case of a direct coupling, this output signal of the first output terminal 1303 is coupled to the second input terminal 1367 of the downstream oscillator stage. The signal which is present at the second output terminal 1335 of the first oscillator stage and has a phase angle of 0° is coupled to the first input terminal 1363 of the downstream oscillator stage.

In contrast to this, the cross-coupling is embodied as follows.

By way of example, the signal at the first output terminal 1303 of a first oscillator stage has a phase angle of 180°. In the case of a cross-coupling, this output signal of the first output terminal 1303 is coupled to the first input terminal 1363 of the downstream oscillator stage. The signal which is present at the second output terminal 1335 of the first oscillator stage and has a phase angle of 0° is coupled to the second input terminal 1367 of the downstream oscillator stage.

Any arbitrary number of stages is possible in the case of serial coupling of oscillator stages. In this case, the phase difference between the successive stages is dependent on the number of stages which are present in an oscillator ring. In this case, the phase shift within the entire oscillator ring must amount to a multiple of $2\pi$.

One disadvantage of a serial oscillator ring, however, is that, on account of the serial coupling, both the oscillator transistors and the coupling transistors must have a relatively large width in order to enable enough current through the respective active branch of the circuit, because the oscillator transistors and the coupling transistors are not in the same state. This results in high parasitic capacitances within the oscillator ring, which adversely affect the frequency tuning capability and the current consumption of the oscillator ring. An additional disadvantage is that as a result of the enlargement of the dimensions of the transistors which accompanies the relatively large widths of the transistors, there is the risk of the inherent noise of the transistors being increased, which in turn contributes to a higher phase noise of the oscillator.

An oscillator basic stage for a parallel coupling is described below with reference to FIG. 14. An inductance 1400 is coupled to a first node 1401 at a first end. The first node 1401 is coupled to a second node 1402. The second node 1402 is coupled to a first output terminal 1403. Furthermore, the second node 1402 is coupled to a third node 1404. The third node 1404 is coupled to a fourth node 1405. The fourth node 1405 is coupled to a fifth node 1406. The fifth node 1406 is coupled to a first source/drain terminal 1407 of a first transistor 1408. The second source/drain terminal 1409 of the first transistor 1408 is coupled to a sixth node 1410. Furthermore, a bulk terminal 1411 of the first transistor 1408 is coupled to a seventh node 1412. The seventh node 1412 is coupled to the sixth node 1410. The sixth node 1410 is furthermore coupled to an eighth node 1413. The eighth node 1413 is coupled to a reference voltage source 1414. The eighth node 1413 is furthermore coupled to a ninth node 1415, which is coupled to a first source/drain terminal 1416 of a second transistor 1417. Furthermore, the ninth node 1415 is coupled to a bulk terminal 1418 of the second transistor 1417. The second source/drain terminal 1419 of the second transistor 1417 is coupled to a tenth node 1420. The tenth node 1420 is coupled to an eleventh node 1421. The eleventh node 1421 is coupled to a twelfth node 1422.

Furthermore, the eleventh node 1421 is coupled to the gate terminal 1423 of the first transistor 1408 and the gate terminal 1424 of the second transistor 1417 is coupled to the fourth node 1405.

The twelfth node 1422 is coupled to a thirteenth node 1425. Furthermore, the twelfth node 1422 is coupled to a first terminal of a first varactor 1471. The second terminal of the first varactor 1471 is coupled to a fourteenth node 1426. The fourteenth node 1424 is coupled to a tuning voltage source 1427. Furthermore, the fourteenth node 1426 is coupled to a first terminal of a second varactor 1428. The second terminal of the varactor 1428 is coupled to the third node 1404.

The two varactors 1471 and 1428 may also be formed as one individual varactor.

The thirteenth node 1425 is coupled to a fifteenth node 1429. Furthermore, the thirteenth node 1425 is coupled to a second output terminal 1430. The fifteenth node 1429 is coupled to a sixteenth node 1431 and furthermore to the second terminal of the inductance 1400.

The sixteenth node 1431 is coupled to a third source/drain terminal 1432 of a third transistor 1433. The second source/drain terminal 1434 of the first transistor 1433 is coupled to a seventeenth node 1435. Furthermore, a bulk terminal 1436 of the third transistor 1433 is coupled to an eighteenth node 1437. The eighteenth node 1437 is coupled to the seventeenth node 1435. The seventeenth node 1435 is furthermore coupled to a nineteenth node 1438. The nineteenth node 1438 is coupled to a supply voltage source 1439. The nineteenth node 1438 is furthermore coupled to a twentieth node 1440, which is coupled to a first source/drain terminal 1441 of a fourth transistor 1442. Furthermore, the twentieth node 1440 is coupled to a bulk terminal 1443 of the fourth transistor 1442. The second source/drain terminal 1444 of the fourth transistor 1442 is coupled to the twenty-first node 1445. The twenty-first node 1445 is coupled to a twenty-second node 1446. The twenty-second node 1446 is coupled to the first node 1401.

Furthermore, the twenty-second node 1446 is coupled to the gate terminal 1447 of the third transistor 1433 and the gate terminal 1448 of the fourth transistor 1442 is coupled to the sixteenth node 1431.

The oscillator stage and the two differential output terminals have been described above with reference to FIG. 14. However, the oscillator stage additionally also has input terminals, which are described below.

The input terminals are formed by means of the gate terminals of four additional transistors which are connected in parallel with the first four transistors.

The fifth node 1406 is coupled to a first source/drain terminal 1449 of a fifth transistor 1450. The second source/drain terminal 1451 of the fifth transistor 1450 is coupled to the sixth node 1410. A bulk terminal 1472 of the fifth transistor 1450 is coupled to the seventh node 1412. The gate terminal 1452 of the fifth transistor 1450 is coupled to a twenty-third node 1453. The twenty-third node 1453 is coupled to a first input terminal 1454. Furthermore, the twenty-third node 1453 is coupled to the gate terminal 1455 of a sixth transistor 1456. A first source/drain terminal 1457 of the sixth transistor 1456 is coupled to the twenty-first node 1445. The second source/drain terminal 1458 of the sixth transistor 1456 is coupled to the twentieth node 1440. Furthermore, a bulk terminal 1459 of the sixth transistor 1456 is coupled to the twentieth node 1440.

The tenth node 1420 is coupled to a first source/drain terminal 1460 of a seventh transistor 1461. The second source/drain terminal 1462 of the seventh transistor 1461 is coupled to the ninth node 1415. A bulk terminal 1473 of the seventh transistor 1461 is coupled to the ninth node 1415. The gate terminal 1463 of the seventh transistor 1461 is coupled to a twenty-fourth node 1464. The twenty-fourth node 1464 is coupled to a second input terminal 1465. Furthermore, the twenty-fourth node 1454 is coupled to the gate terminal 1466 of an eighth transistor 1467. A first source/drain terminal 1468 of the eighth transistor 1467 is coupled to the sixteen node 1431. The second source/drain terminal 1469 of the eighth transistor 1467 is coupled to the seventeenth node 1435. Furthermore, a bulk terminal 1470 of the eighth transistor 1467 is coupled to the eighteenth node 1427.

In general, the first transistor, the second transistor, the third transistor and the fourth transistor represent oscillation transistors of the oscillator stage, whereas the fifth transistor, the sixth transistor, the seventh transistor and the eighth transistor represent coupling transistor of the oscillator stage.

With reference to FIG. 14, it can likewise be explained more precisely what is to be understood by the direct coupling already mentioned above and the cross-coupling.

By way of example, the signal at the first output terminal 1403 of a first oscillator stage has a phase angle of 180°. In the case of a direct coupling, this output signal of the first output terminal 1403 is coupled to the second input terminal 1465 of the downstream oscillator stage. The signal which is present at the second output terminal 1430 of the first oscillator stage and has a phase angle of 0° is coupled to the first input terminal 1454 of the downstream oscillator stage.

In contrast to this, the cross-coupling is embodied as follows.

By way of example, the signal at the first output terminal 1403 of a first oscillator stage has a phase angle of 180°. In the case of a cross-coupling this output signal of the first output terminal 1403 is coupled to the first input terminal 1454 of the downstream oscillator stage. The signal which is present at the second output terminal 1430 of the first oscillator stage and has a phase angle of 0° is coupled to the second input terminal 1465 of the downstream oscillator stage.

Any arbitrary number of stages is possible in the case of a parallel coupling of oscillator stages. In this case, the phase difference between the successive stages is dependent on the number of stages which are present in an oscillator ring; by way of example, with the use of two oscillator stages, the signals are in quadrature since a phase rotation of ±90° results.

By means of a parallel coupling of oscillator stages, in comparison with the serial coupling smaller widths both of the oscillation oscillators and of the coupling oscillators are possible since the currents are cumulated in the case of the parallel circuit respectively comprising two transistors as illustrated in FIG. 14. As a result, the varactor that is required to enable a predetermined frequency range to be covered can likewise be reduced in size. This in turn permits the inductance to be enlarged and hence an additional reduction both of the phase noise and of the current consumption of the oscillator ring with parallel coupling of the oscillator stages.

By means of a parallel coupling of oscillator stages, in comparison with single-stage oscillators with a corresponding basic cell, that is to say a basic cell as illustrated in FIG. 10, a reduction of the phase noise is possible according to simulation calculations. For an oscillator ring comprising two oscillator stages connected in parallel, a reduction of the phase noise by up to 7 dBc is produced in simulations at an oscillator frequency of between 3.0 GHz and 4.2 GHz. For an oscillator ring comprising four oscillator stages connected in parallel, a reduction of the phase noise by about 8 dBc/Hz, where dBc means "dB with respect to carrier power", is produced in simulations at an oscillator frequency of between 3.0 GHz and 4.2 GHz compared with an oscillator ring comprising two oscillator stages connected in parallel.

Compared with serial coupling, a parallel coupling of the individual oscillator stages, given a number of four oscillator stages, exhibits an improvement of up to 8 dBc/Hz according to simulations.

A significant disadvantage of the parallel coupling of oscillator stages to form an oscillator ring is that it has been found that a plurality of oscillator states are possible. As a result of this, some specimens of oscillator rings with parallel coupling have clock signals having a phase angle of 0° and −90° instead of clock signals having a phase angle of 0° and +90°. These two different "types" of oscillator rings then also have a different value for the phase noise. Consequently, the oscillator rings comprising oscillator stages coupled in parallel cannot be used without problems for generating two clock signals having a fixed, predeterminable phase angle.

In addition, the devices in accordance with the prior art have overall complicated interconnection.

Furthermore, U.S. Pat. No. 6,417,740 B1 discloses a signal generator for a variable frequency, which is formed as a voltage controlled oscillator circuit and which has broadband and/or multiband frequency output function and uses two control voltages.

U.S. Pat. No. 6,198,360 B1 discloses a circuit and a method used in LC or ring oscillators, the frequency of the oscillation being modulated by means of detecting a quadrature signal and by means of controlling the sign and the strength of the quadrature signal.

U.S. Pat. No. 6,617,936 B2 discloses an oscillator circuit which achieves the phase-shifting of an oscillating signal toward the phase of an input signal coupled to the oscillating signal.

SUMMARY

One aspect of the invention provides an injection-locked oscillator circuit which has a simplified interconnection and a more uniform phase noise and whose output signals have a fixed phase angle with respect to one another.

An injection-locked oscillator circuit according to one embodiment of the invention has at least two oscillator stages, each oscillator stage having an inductance, a capacitance, at least one output node, a coupling-switching element subcircuit comprising at least one coupling-switching element, the inductance and the capacitance being connected in parallel, and the coupling-switching element subcircuit which being coupled in parallel with the inductance and the capacitance in such a way that in each case precisely one coupling-switching element is present serially, and at least one input terminal formed by means of the control terminal of the coupling-switching element, the oscillator stages of the injection-locked oscillator circuit being coupled by means of the coupling-switching element subcircuit.

The injection-locked oscillator circuit according to one embodiment of the invention, unlike advantage over the prior art that it obtains an identical phase noise, which is always reduced in comparison with a single-stage structure, for the clock signals of the two possible phase angles of +90° and −90°, the phase noise being identical to the lowest phase noise of the two phase noises of the injection-locked oscillator circuit in accordance with the topology illustrated in "Low Power, Low-Phase-Noise differentially tuned Quadrature VCO Design in Standard CMOS"; Tiebout M., Journal of Solid State Circuits, Vol. 36, No. 7, (July 2001) pp. 1018-1024.

One aspect of the inventive idea consists in the fact that at least two oscillator stages, also called oscillator subcircuits, are coupled by means of "injection locking" to form a fully symmetrical quadrature oscillator, that is to say to form a fully symmetrical injection-locked oscillator circuit, also called ILO circuit, a coupling subcircuit being connected in parallel with the inductance and the capacitance of each individual oscillator stage. Only series circuits of an individual coupling-switching element are ever formed within the coupling subcircuit, that is to say that there are no serially connected coupling-switching elements within the coupling subcircuit, but a plurality of coupling-switching elements connected in parallel may be formed.

In the fully symmetrical arrangement of two quadrature oscillators according to the invention, that is to say the oscillator stages, the two quadrature oscillators synchronize each other and, as a result, a cleaner zero crossing occurs, that is to say a zero crossing of the clock signals occurs which is subjected to reduced fluctuations (jitter). A cleaner zero crossing in turn means less noise in the phase space. Consequently, the mutual synchronization according to the invention of the two oscillator subcircuits leads to a reduction of the phase noise.

In one example, each oscillator stage has precisely two output terminals at which signals that are differential with respect to one another are present.

In other words, at a first output terminal of each oscillator stage a signal is present which is differential with respect to a signal which is present at the second output signal.

In one development, the coupling-switching element subcircuit has two additional coupling-switching elements which are connected up to one another and are in each case connected in parallel with the coupling-switching elements connected up to one another.

The arrangement of in each case two coupling-switching elements which are connected in parallel and which may be regarded as a pair of coupling-switching elements reduces the resistance of the circuit in the on state, which in turn leads to a more symmetrical ILO circuit.

The coupling-switching elements are in one case transistors.

The transistors may be NMOS and/or PMOS transistors.

PMOS transistors have the advantage that they have a low so-called "flicker noise", which leads to a low phase noise. In general, the transistors may be all types of CMOS transistors. Instead of CMOS transistors, it is also possible to use so-called SOI transistors, that is to say transistors which are formed on an SOI substrate.

In one example, a respective one of the transistors connected in parallel is a PMOS transistor and the other transistor connected in parallel is an NMOS transistor.

Especially in the arrangement of in each case two transistors which are connected in parallel and which may be regarded as a pair of transistors in which one of the transistors of a pair is formed as a PMOS transistor and the other transistor of the pair is formed as an NMOS transistor reduces the resistance of the circuit in the on state. Furthermore, both half-phases of an AC voltage clock signal can be used, which leads to a more symmetrical circuit.

In one development, the capacitances are formed by means of varactors.

The use of varactors as capacitances makes it possible to provide variable capacitances in the ILO circuit, which leads to an improved tunability of the frequency of the ILO circuit. The varactors may be formed for example by means of transistors or diodes.

In one example, an even number of oscillator stages are coupled to form an injection-locked oscillator circuit.

When using an even number of oscillator stages which are coupled to form an ILO circuit, the coupling is particularly simple and symmetrical since identically constructed oscillator stages can be used.

The number of input terminals of each oscillator stage can be equal to the number of oscillator stages of the injection-locked oscillator circuit.

If oscillator stages having a number of input terminals which is equal to the number of oscillator stages are used, it emerges for the case of differential output terminals of the oscillator stages that each oscillator stage can be coupled to, that is to say synchronized with, all the other oscillator stages which have a matching phase angle. As a result of this, the synchronization is improved and the phase noise can be reduced further.

In one example development, the injection-locked oscillator circuit has four oscillator stages, each oscillator stage having precisely four input terminals and precisely two output terminals and two of the input terminals being coupled to the output terminals of a preceding oscillator stage of the injection-locked oscillator circuit, and the other two input terminals being coupled to the output terminals of the downstream injection-locked oscillator circuit.

By means of the use of four oscillator stages within an ILO circuit, the synchronization can be intensified and the phase noise can thus additionally be reduced. Each oscillator stage of the ILO circuit comprising four oscillator stages is synchronized both with the downstream oscillator stage and with the preceding oscillator stage. In this case, the phase shift of the signals which are present at the output terminals is always 90° from one oscillator stage to the downstream oscillator stage within the ILO circuit. The coupling of the individual oscillator stages is carried out by means of the so-called "tank lock" coupling, that is to say that the coupling is effected directly via the tank of the oscillator stage.

The oscillator stages of the injection-locked oscillator circuit in one example have an active element.

Such an active element may be formed for example by means of a tunnel diode or by means of transistors.

In one development of the injection-locked oscillator circuit, the injection-locked oscillator circuit has an odd number of oscillator stages.

It can generally be stated that in an oscillator ring having k oscillator stages, the n-th oscillator stages is coupled to the output terminals of all mod(n+x;k) oscillator stages, where x runs through all odd numbers from 1 to k, or expressed mathematically $x=\{x|mod(x+1;2)=0\}$, where "mod" represents the modulo function. In other words, any given oscillator stage is always coupled to all oscillator stages which have phase shifts of 90° with respect to the given oscillator stage.

With the oscillator stages according to one embodiment of the invention, on account of the method of operation of the coupling transistors, it is not necessary to take into consideration the phase angle of the signals in the branches which serve for the feedback of an oscillator stages. That is to say that cross-coupling and direct coupling of the individual oscillator stages among one another yields the same result.

Coupling according to one embodiment of the invention gives rise to a synchronization of the zero crossings of an oscillator stage with the minima/maxima of the preceding oscillator stage. This synchronization ensures that temporal variations (jitter) in the zero crossings are reduced, which is tantamount to lower phase noise.

With the use of more than two oscillator stages within an ILO circuit, the synchronization can be intensified and the phase noise can thus additionally be reduced. Thus, in the case of an ILO circuit comprising four oscillator stages, each oscillator stage is synchronized both with the downstream oscillator stage and with the preceding oscillator stage.

With regard to an ILO circuit according to one embodiment of the invention it should furthermore be noted that the coupling of the individual oscillator stages is carried out directly via the tank of the oscillator stage and, furthermore, the configuration of the individual oscillator stages of the ILO circuit depends on the number of oscillator stages within the ILO circuit. In particular, with an even number of oscillator stages within the ILO circuit, the number of input terminals is equal to the number of oscillator stages.

PMOS transistors were used in one example for the coupling transistors in the realization under consideration, because PMOS transistors have a lower so-called "flicker noise" than NMOS transistors. However, it is also possible to use NMOS transistors. In principle, it is also possible to carry out the coupling with only one transistor per feedback stage.

It is also possible to replace a switching element by a transfer element, or to use only NMOS transistors instead of PMOS transistors. According to the invention, it is also possible to use SOI transistors, that is to say transistors which are formed on an SOI substrate.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
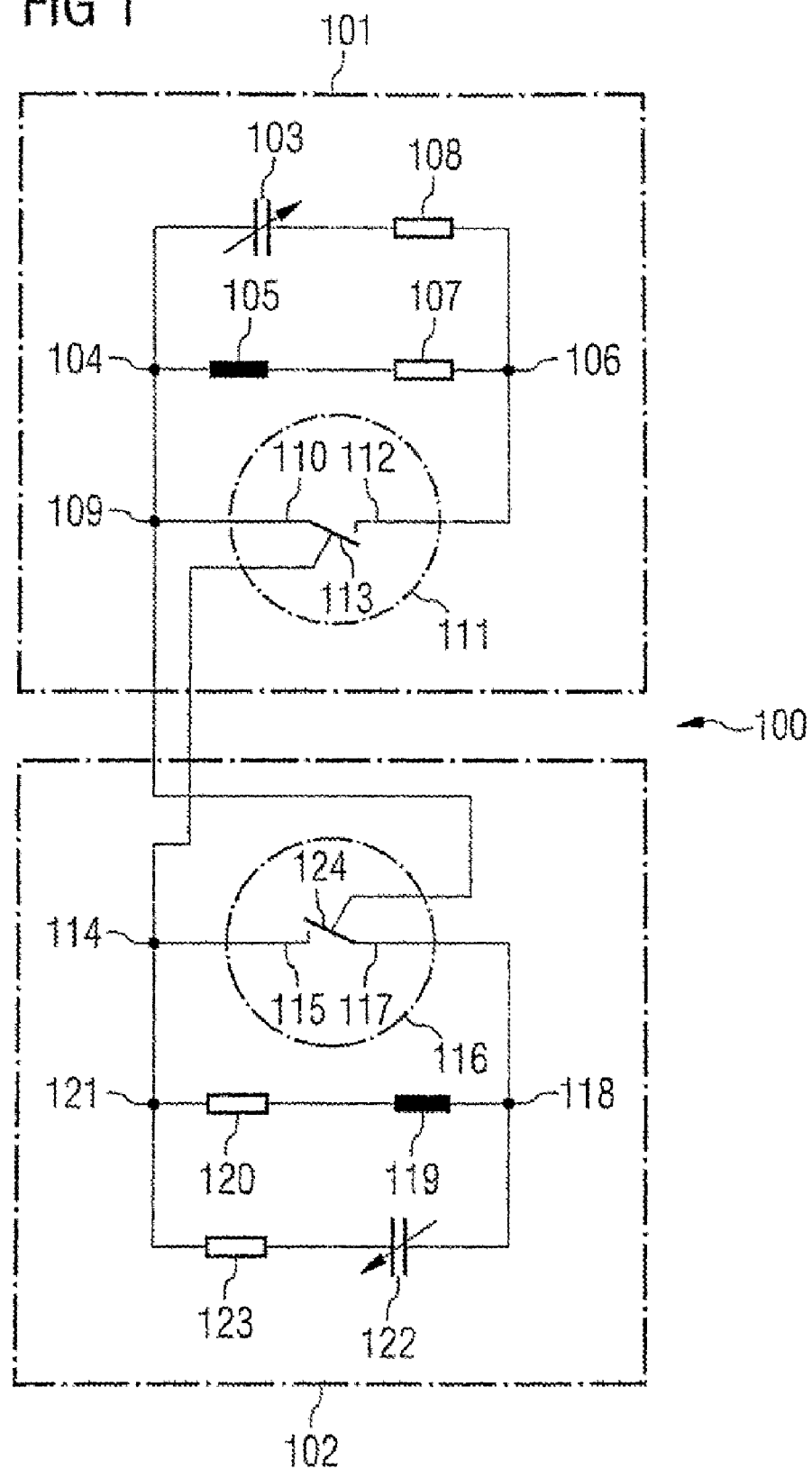
FIG. 1 illustrates a schematic illustration of a circuit arrangement of an injection-locked oscillator circuit in accordance with a first exemplary embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the exemplary embodiments of the invention, predominantly CMOS transistors are described and illustrated in the Figures, but the transistors used may also be SOI transistors, that is to say transistors which are formed by means of an SOI substrate. The coupling of bulk terminals of transistors that is explained in the exemplary embodiments is also to be regarded only by way of example. According to the invention, the bulk terminals of the transistors may be coupled not only to a supply voltage but, for example, also to a center potential, a reference voltage source, to ground and/or to the source terminal. The bulk terminals may also be operated in "floating", that is to say unconnected, fashion. In particular, generally no bulk terminals are used, for example, in the case of SOI transistors.

A description is given below, referring to FIG. 1, of an injection-locked oscillator circuit 100, also designated hereinafter as ILO circuit 100, in accordance with a first exemplary embodiment of the invention.

The ILO circuit 100 has two oscillator stages 101 and 102. The ILO circuit 100 has a first capacitance 103. A first terminal of the first capacitance 103 is coupled to a first node 104. The first node 104 is coupled to a first terminal of a first inductance 105. The second terminal of the first inductance 105 is coupled to a second node 106. In FIG. 1, in addition to the inductance, the resistance thereof is also depicted by a resistance 107, but the latter is not to be understood as a separate resistance, but rather represents the resistance of the first inductance 105. The second node 106 is coupled to the second terminal of the first capacitance 103. For the first capacitance, too, the equivalent resistance is depicted as a dedicated symbol 108 in FIG. 1.

Furthermore, the first node 104 is coupled to the third node 109. The third node 109 is coupled to a first source/drain terminal 110 of a first transistor 111. The second source/drain terminal 112 of the first transistor 111 is coupled to the second node 106.

The gate terminal 113 of the first transistor 111 is coupled to a fourth node 114. The fourth node 114 is coupled to a first source/drain terminal 115 of a second transistor 116. The second source/drain terminal 117 of the second transistor 116 is coupled to the fifth node 118. The fifth node 118 is coupled to a first terminal of a second inductance 119. For the second inductance 119, too, the equivalent resistance is depicted as a dedicated symbol 120 in FIG. 1. The second terminal of the second inductance 119 is coupled to a sixth node 121. The sixth node 121 is coupled to the fourth node 114. Furthermore, the sixth node 121 is coupled to a first terminal of a second capacitance 122. The second terminal of the second capacitance 122 is coupled to the fifth node 118. For the second capacitance 122, too, the equivalent resistance is depicted as a dedicated symbol 123 in FIG. 1. Furthermore, the gate terminal 124 of the second terminal 116 is coupled to the third node 109.

The entire ILO circuit according to one embodiment of the invention has thus been described. The first capacitance 103, the first inductance 105 and the first transistor 111 together form the first oscillator stage 101. The second capacitance 122, the second inductance 119 and the second transistor 116 together form the second oscillator stage 102. The first and second oscillator stages are coupled by means of the two transistors, for which reason the transistors 111 and 116 are also referred to as coupling transistors. The first and second capacitances may be formed as so-called varactors, that is to say as variable capacitances. The varactors may be formed for example by means of transistors or diodes.

In the above-described fully symmetrical arrangement according to one embodiment of the invention of two oscillator stages, which are also referred to as quadrature oscillators, the two quadrature oscillators synchronize each other, which results in a cleaner zero crossing, that is to say a zero crossing subjected to reduced fluctuations (jitter), of the clock signals. This mutual synchronization is referred to as injection locking. A cleaner zero crossing in turn means less noise in the phase space. Consequently, the reciprocal synchronization of the two oscillator stages according to the invention leads to a reduction of the phase noise.

A tapping off of the quadrature signal of the ILO circuit 100 for an I/Q (de)modulation is possible at the second node 106, by way of example.

A description is given below, referring to FIG. 2, of an injection-locked oscillator circuit 200, which is modified relative to the exemplary embodiment of FIG. 1 to the effect that it has a second transistor per oscillator stage. Consequently, the ILO circuit 200 has two transistor pairs, the transistors of a pair, that is to say of an oscillator stage, being connected in parallel with one another. In addition, each of the oscillator stages of the ILO circuits 200 illustrated in FIG. 2 also has a "negative resistance", that is to say an active element, which may be formed for example by means of a tunnel diode or by means of transistors.

The ILO circuit 200 has two oscillator stages 201 and 202. The ILO circuit 200 has a first capacitance 203. A first terminal of the first capacitance 203 is coupled to a first node 204. The first node 204 is coupled to a first terminal of a first inductance 205. The second terminal of the first inductance 205 is coupled to a second node 206. In FIG. 2, in addition to the inductance, the resistance thereof is also depicted by a resistance 207, but the latter is not to be understood as a separate resistance, but rather represents the resistance of the first inductance 205. The second node 206 is coupled to the second terminal of the first capacitance 203. For the first capacitance, too, the equivalent resistance is depicted as a dedicated symbol 208 in FIG. 2.

Furthermore, the first node 204 is coupled to a third node 209. The third node 209 is coupled to a fourth node 210. The fourth node 210 is coupled to a first source/drain terminal 211 of a first transistor 212. The second source/drain terminal 213 of the first transistor 212 is coupled to a fifth node 214. The fifth node 214 is coupled to a sixth node 215. The sixth node 215 is coupled to the second node 206, on the one hand; on the other hand, the sixth node 215 is coupled to a first terminal of a first active element 216 (negative resistance). The second terminal of the first active element 216 is coupled to the third node 209.

The fourth node 210 is furthermore coupled to a seventh node 217. The seventh node 217 is coupled to a first source/drain terminal 218 of a second transistor 219. The second source/drain terminal 220 of a second transistor 219 is coupled to an eighth node 222. The eighth node 222 is coupled to the fifth node 214.

The gate terminal 223 of the first transistor 212 is coupled to a ninth node 224. The ninth node 224 is coupled to a first source/drain terminal 225 of a third transistor 226. The second source/drain terminal 227 of the third transistor 226 is coupled to a tenth node 228. The tenth node 228 is coupled to the gate terminal 229 of the second transistor 219. The gate terminal 245 of the third transistor 226 is coupled to the seventh node 217.

The tenth node 228 is furthermore coupled to an eleventh node 230. The eleventh node 230 is coupled to a first source/drain terminal 231 of a fourth transistor 232. The second source/drain terminal 233 of the fourth transistor 232 is coupled to a twelfth node 234. The twelfth node 234 is coupled to the ninth node 224. The gate terminal 235 of the fourth transistor 232 is coupled to the eighth node 222.

The twelfth node 234 is furthermore coupled to a thirteenth node 236. The thirteenth node 236 is furthermore coupled to a first terminal of a second active element 237. The second terminal of the second active element 237 is coupled to a fourteenth node 238. The fourteenth node 238 is coupled to the eleventh node 230.

Furthermore, the fourteenth node 238 is coupled to a fifteenth node 239. The fifteenth node 239 is coupled to a first terminal of a second inductance 240. For the second inductance 240, too, the equivalent resistance is depicted as a dedicated symbol 241 in FIG. 2. The second terminal of the second inductance 240 is coupled to a sixteenth node 242. The sixteenth node 242 is coupled to the thirteenth node 236. Furthermore, the sixteenth node 242 is coupled to a first terminal of a second capacitance 243. The second terminal of the second capacitance 243 is coupled to the fifteenth node 239. For the second capacitance 243, too, the equivalent resistance is depicted as a dedicated symbol 244 in FIG. 2.

Figure 2:
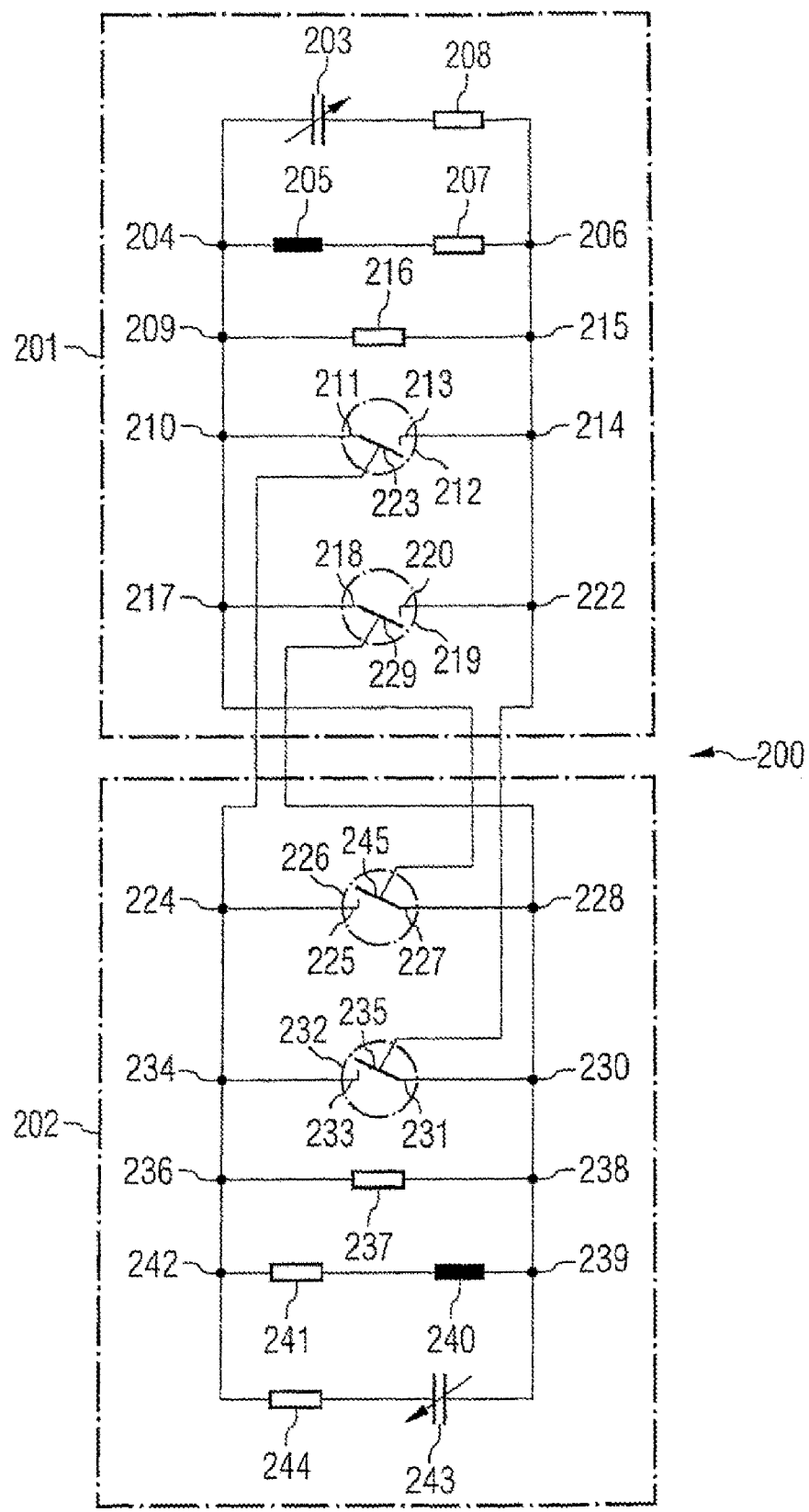
FIG. 2 illustrates a schematic illustration of a circuit arrangement of an injection-locked oscillator circuit from FIG. 1 with an additional pair of coupling transistors.

The entire ILO circuit illustrated in FIG. 2 has thus been described. The first capacitance 203, the first inductance 205, the first active element 216, the first transistor 212 and the second transistor 219 together form the first oscillator stage 201. The second capacitance 243, the second inductance 240, the second active element 237, the third transistor 226 and the fourth transistor 232 together form the second oscillator stage 202. The first and second oscillator stages are coupled by means of the four transistors. These four transistors in turn represent coupling transistors. The first and second capacitances may be formed as so-called varactors, that is to say as variable capacitances.

It should furthermore be noted that the oscillator stage illustrated in FIG. 1 should also be provided with an active element. The use of an active element has the effect that the oscillation amplitude of the signal of the injection-locked oscillator circuit does not disappear and is stabilized. Any known embodiment, for example, a tunnel diode or transistors, may be used for the realization of an active element.

The transistors of the ILO circuits illustrated in FIGS. 1 and 2 are CMOS transistors. SOI transistors may also be used according to embodiments of the invention.

Exemplary embodiments of three injection locked oscillator circuits are explained below with reference to FIGS. 3a to 3c.

Figure 3A:
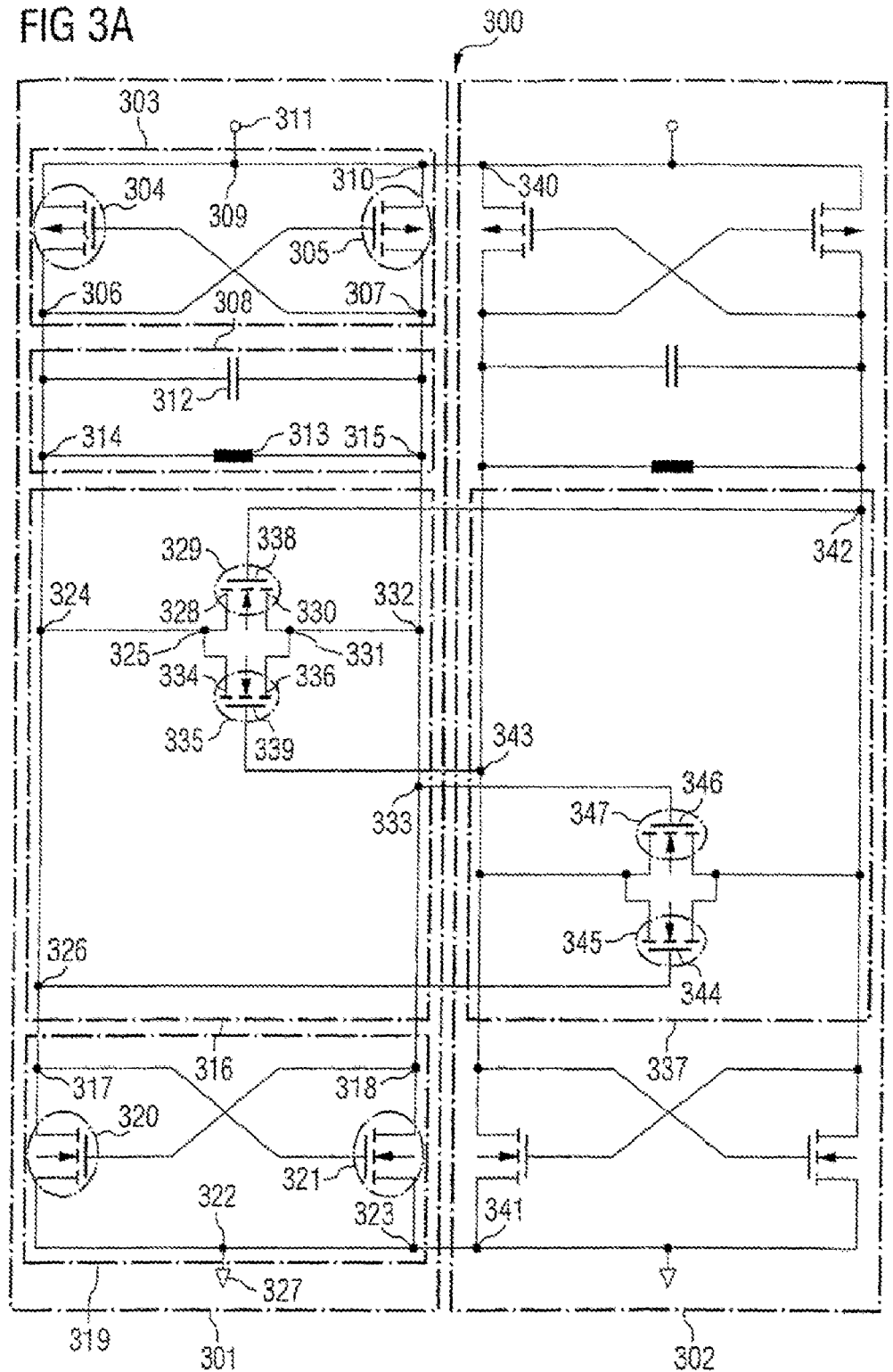
FIG. 3 illustrates a schematic illustration of three circuit arrangements 3a, 3b and 3c of injection-locked oscillator circuits according to the invention.

FIG. 3a illustrates an injection-locked oscillator circuit 300 comprising two oscillator stages 301 and 302. The first oscillator stage 301 has a first oscillator transistor subcircuit 303. The first oscillator transistor subcircuit 303 has a first transistor 304 and a second transistor 305, which are cross-connected up to one another, and the first transistor 304 and the second transistor 305 having a bulk terminal. The first oscillator transistor subcircuit 303 is connected in parallel with an LC element 308 of the first oscillator stage 301 via a first node 306 and a second node 307. Furthermore, the first oscillator transistor subcircuit 303 has a third node 309 and fourth node 310. The third node 309 is coupled to a supply voltage source 311.

The LC element 308 has a capacitance 312 and an inductance 313, which are connected up in parallel. The LC element 308 is furthermore coupled in parallel with a coupling transistor subcircuit 316 by means of a fifth node 314 and a sixth node 315.

The coupling transistor subcircuit 316 will be described more extensively below. Furthermore, the coupling transistor subcircuit 316 is coupled to a second oscillator transistor subcircuit 319 by means of a seventh node 317 and an eighth node 318.

The second oscillator transistor subcircuit 319 has a third transistor 320 and a fourth transistor 321, which are cross-connected up to one another, and the third transistor 320 and the fourth transistor 321 having a bulk terminal. Furthermore, the second oscillator transistor subcircuit 319 has a ninth node 322 and a tenth node 323. The ninth node 322 is coupled to a reference voltage source 327.

The coupling transistor subcircuit 316, which in principle is formed by means of two transistors connected in parallel, is described in detail below. The coupling transistor subcircuit 316 has an eleventh node 324, which is coupled to the fifth node 314. Furthermore, the eleventh node is coupled to a twelfth node 325 and to a thirteenth node 326. The thirteenth node 326 is coupled to the seventh node 317. The twelfth node 325 is coupled to a first source/drain terminal 328 of a fifth transistor 329. The second source/drain terminal 330 of the fifth transistor 329 is coupled to a fourteenth node 331. The fourteenth node 331 is coupled to a fifteenth node 332, which is coupled to the sixth node 315. Furthermore, the fifteenth node 332 is coupled to a sixteenth node 333, which is coupled to the eighth node 318.

The twelfth node 325 is furthermore coupled to a first source/drain terminal 334 of a sixth transistor 335. The second source/drain terminal 336 of the sixth transistor 335 is coupled to the fourteenth node 331.

In the exemplary embodiment, the fifth transistor 329 and the sixth transistor 335 are NMOS transistors having a bulk terminal. However, they may also be PMOS transistors having a bulk terminal.

In the exemplary embodiment, the elements described above form the first oscillator stage 301 of the ILO circuit 300. The second oscillator stage 302 of the ILO circuit 300 is structurally identical to the first oscillator stage 301. Therefore, only the coupling of the two oscillator stages is described in more detail below. It should be taken into consideration that in FIG. 3a the coupling transistor subcircuit 337 of the second oscillator stage 302 has been rotated through 180° relative to the coupling transistor subcircuit 316 of the first oscillator stage 301.

The two oscillator stages are coupled by means of the fourth node 310, the tenth node 323, the thirteenth node 326, the sixteenth node 333, the gate terminal 338 of the fifth transistor 329 and the gate terminal 339 of the sixth transistor 335.

The coupling of the two oscillator stages is as follows:

The fourth node 310 of the first oscillator stage 301 is coupled to the fourth node 340 of the second oscillator stage 302.

The tenth node 323 of the first oscillator stage 301 is coupled to the tenth node 341 of the second oscillator stage 302.

The gate terminal 338 of the fifth transistor 329 of the first oscillator stage 301 is coupled to the thirteenth node 342 of the second oscillator stage 302.

The gate terminal 339 of the sixth transistor 335 of the first oscillator stage 301 is coupled to the sixteenth node 343 of the second oscillator stage 302.

The thirteenth node 326 of the first oscillator stage 301 is coupled to the gate terminal 344 of the fifth transistor 345 of the second oscillator stage 302.

The sixteenth node 333 of the first oscillator stage 301 is coupled to the gate terminal 346 of the sixth transistor 347 of the second oscillator stage 302.

A description is given below, referring to FIG. 3b, of another exemplary embodiment of an injection-locked oscillator circuit, which differs from that illustrated in FIG. 3a by virtue of the fact that the coupling transistor subcircuit of the oscillator stages has four transistors in each case.

Figure 3B:
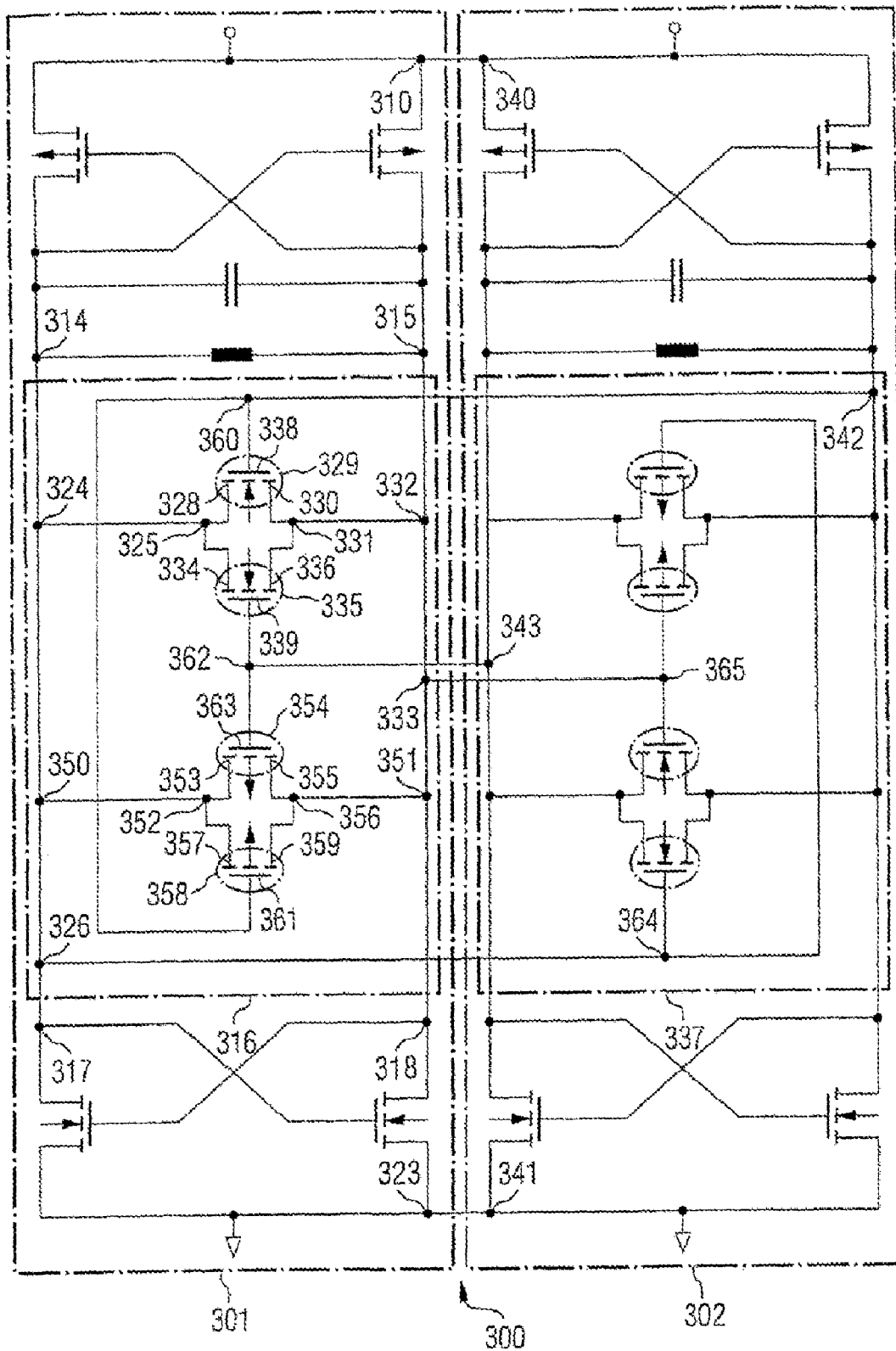

Since, in FIG. 3b, only the coupling transistor subcircuit of an oscillator stage differs from the oscillator stage from FIG. 3a, only the coupling transistor subcircuit 316 is described in more detail, and identical or similar designations and reference symbols refer to identical or similar component parts.

The coupling transistor subcircuit 316 has an eleventh node 324, which is coupled to a fifth node 314. Furthermore, the eleventh node is coupled to a twelfth node 325 and to a seventeenth node 350. The seventeenth node 350 is coupled to the thirteenth node 326. The thirteenth node 326 is coupled to a seventh node 317.

The twelfth node 325 is coupled to a first source/drain terminal 328 of a fifth transistor 329. The second source/drain terminal 330 of the fifth transistor 329 is coupled to a fourteenth node 331. The fourteenth node 331 is coupled to a fifteenth node 332, which is coupled to a sixth node 315. Furthermore, the fifteenth node 332 is coupled to a sixteenth node 333, which is coupled to an eighteenth node 351, which is in turn coupled to an eighth node 318.

The twelfth node 325 is furthermore coupled to a first source/drain terminal 334 of a sixth transistor 335. The second source/drain terminal 336 of the sixth transistor 335 is coupled to the fourteenth node 331.

In the exemplary embodiment, the fifth transistor 329 and the sixth transistor 335 are NMOS transistors having a bulk terminal. However, they may also be PMOS transistors having a bulk terminal.

The seventeenth node 350 is coupled to a nineteenth node 352. The nineteenth node 352 is coupled to a first source/drain terminal 353 of a seventh transistor 354. The second source/drain terminal 355 of the seventh transistor 354 is coupled to a twentieth node 356. The twentieth node 356 is coupled to the eighteenth node 351.

The nineteenth node 352 is furthermore coupled to a first source/drain terminal 357 of an eighth transistor 358. The second source/drain terminal 359 of the eighth transistor 358 is coupled to the twentieth node 356.

In the exemplary embodiment, the seventh transistor 354 and the eighth transistor 358 are PMOS transistors having a bulk terminal. However, they may also be NMOS transistors having a bulk terminal. It should be taken into consideration, however, that they are in one example of the opposite type to the fifth and the sixth transistor, that is to say that if the fifth and sixth transistors are PMOS transistors, then the seventh and the eighth transistors are in one example NMOS transistors.

The gate terminal 338 of the fifth transistor 329 is coupled to a twenty-first node 360, which is coupled to the gate terminal 361 of the eighth transistor 358. The gate terminal 339 of the sixth transistor 335 is coupled to a twenty-second node 362, which is coupled to the gate terminal 363 of the seventh transistor 354.

In the exemplary embodiment of FIG. 3b, the elements described above form the coupling transistor subcircuit 316 of the first oscillator stage 301 of the injection locked oscillator circuit 300. The other elements of the first oscillator stage 301 are identical to the elements of the oscillator stage illustrated in FIG. 3a. The second oscillator stage 302 of the injection-locked oscillator circuit 300 is structurally identical to the first oscillator stage 301. Therefore, only the coupling of the two oscillator stages is described in more detail below. It should be taken into consideration that, in FIG. 3b, the coupling transistor subcircuit 337 of the second oscillator stage 302 is rotated through 180° relative to the coupling transistor subcircuit 316 of the first oscillator stage 301.

The two oscillator stages are coupled by means of the fourth node 310, the tenth node 323, the thirteenth node 326, the sixteenth node 333, the twenty-first node 360 and the twenty-second node 362.

The coupling of the two oscillator stages is as follows:

The fourth node 310 of the first oscillator stage 301 is coupled to the fourth node 340 of the second oscillator stage 302.

The tenth node 323 of the first oscillator stage 301 is coupled to the tenth node 341 of the second oscillator stage 302.

The twenty-first node 360 of the first oscillator stage 301 is coupled to the thirteenth node 342 of the second oscillator stage 302.

The twenty-second node 362 of the first oscillator stage 301 is coupled to the sixteenth node 343 of the second oscillator stage 302.

The thirteenth node 326 of the first oscillator stage 301 is coupled to the twenty-first node 364 of the second oscillator stage 302.

The sixteenth node 333 of the first oscillator stage 301 is coupled to the twenty-second node 365 of the second oscillator stage 302.

A description is given below, referring to FIG. 3c, of another exemplary embodiment of an injection-locked oscillator circuit, which differs from that illustrated in FIG. 3b principally by virtue of the fact that the coupling of the two oscillator stages is carried out differently, that the first oscillator transistor subcircuit is omitted, and an additional transistor is arranged in the second oscillator transistor subcircuit, said additional transistor being used in order to be able to switch the reference voltage source by means of a bias voltage applied to the gate terminal of the transistor.

Figure 3C:
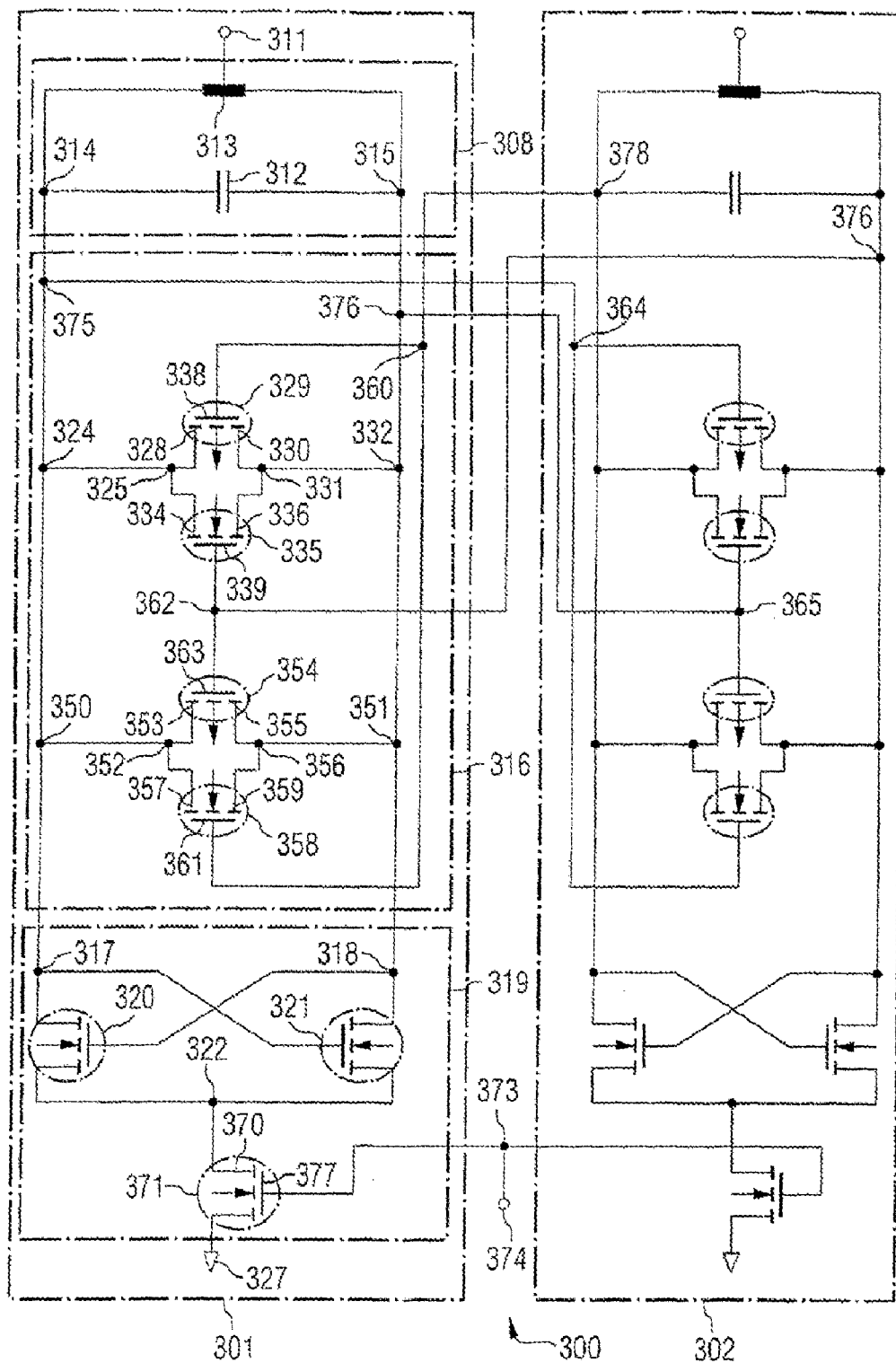

The first oscillator stage 301 of the ILO circuit 300 of the FIG. 3c has an LC element 308, a coupling transistor subcircuit 316 and an oscillator transistor subcircuit 319.

The LC element 308 has an inductance 313 and a capacitance 312, which are connected up in parallel. In addition, the inductance 313 is coupled to a supply voltage source 311. The LC element 308 is furthermore connected in parallel with the coupling transistor subcircuit 316 by means of a fifth node 314 and a sixth node 315.

The coupling transistor subcircuit 316 will be described more extensively below. Furthermore, the coupling transistor subcircuit 316 is coupled to an oscillator transistor subcircuit 319 by means of a seventh node 317 and an eighth node 318.

The oscillator transistor subcircuit 319 has a third transistor 320 and a fourth transistor 321, which are cross-connected up to one another. Furthermore, the oscillator transistor subcircuit 319 has a ninth node 322, which is coupled between the third and the fourth transistor. The ninth node 322 is coupled to a first source/drain terminal 370 of a ninth transistor 371. The second source/drain terminal 372 of the ninth transistor 371 is coupled to a reference voltage source 327. The gate terminal 377 of the ninth transistor is coupled to a twenty-third node 373, which is coupled to a bias voltage source 374.

The coupling transistor subcircuit 316 is described in more detail below. The coupling transistor subcircuit 316 has an eleventh node 324, which is coupled to a twenty-fourth node 375. The twenty-fourth node 375 is coupled to the fifth node 314. Furthermore, the eleventh node is coupled to a twelfth node 325 and to a seventeenth node 350. The seventeenth node 350 is coupled to the seventh node 317.

The twelfth node 325 is coupled to a first source/drain terminal 328 of a fifth transistor 329. The second source/drain terminal 330 of the fifth transistor 329 is coupled to a fourteenth node 331. The fourteenth node 331 is coupled to a fifteenth node 332, which is coupled to a twenty-fifth node 376, which is coupled to the sixth node 315. Furthermore, the fifteenth node 332 is coupled to an eighteenth node 351, which is in turn coupled to the eighth node 318.

The twelfth node 325 is furthermore coupled to a first source/drain terminal 334 of a sixth transistor 335. The second source/drain terminal 336 of the sixth transistor 335 is coupled to the fourteenth node 331.

In the exemplary embodiment, the fifth transistor 329 is a PMOS transistor having a bulk terminal, whereas in the exemplary embodiment the sixth transistor 335 is an NMOS transistor having a bulk terminal. The opposite situation is also possible, however; all that is to be taken into consideration is that the two transistors are in one example of opposite types.

The seventeenth node 350 is coupled to a nineteenth node 352. The nineteenth node 352 is coupled to a first source/drain terminal 353 of a seventh transistor 354. The second source/drain terminal 355 of the seventh transistor 354 is coupled to a twentieth node 356. The twentieth node 356 is coupled to the eighteenth node 351.

The nineteenth node 352 is furthermore coupled to a first source/drain terminal 357 of an eighth transistor 358. The second source/drain terminal 359 of the eighth transistor 358 is coupled to the twentieth node 356.

In the exemplary embodiment, the fifth transistor 329 and the seventh transistor 354 are PMOS transistors having a bulk terminal, whereas in the exemplary embodiment the seventh transistor 354 and the eighth transistor 358 are NMOS transistors having a bulk terminal. The opposite situation is also possible, however. All that should be taken into consideration is that the fifth transistor 329 and the seventh transistor 354 are in one example of the same type, whereas the sixth transistor 335 and the eighth transistor 358 are in one example of the same type but of the different type than the fifth transistor 329 and the seventh transistor 354.

The gate terminal 338 of the fifth transistor 329 is coupled to a twenty-first node 360, which is coupled to the gate terminal 361 of the eighth transistor 358. The gate terminal 339 of the sixth transistor 335 is coupled to a twenty-second node 362, which is coupled to the gate terminal 363 of the seventh transistor 354.

In the exemplary embodiment of FIG. 3c, the elements described above form the first oscillator stage 301 of the injection-locked oscillator circuit 300. The second oscillator stage 302 of the injection locked oscillator circuit 300 is structurally identical to the first oscillator stage 301. Therefore, only the coupling of the two oscillator stages is described in more detail below.

The two oscillator stages are coupled by means of the fifth node 378 of the second oscillator stage 302, the twenty-first nodes, the twenty-second nodes, the twenty-fourth node 375 of the first oscillator stage 301 and the twenty-fifth nodes.

The coupling of the two oscillator stages is as follows:

The twenty-first node 360 of the first oscillator stage 301 is coupled to the fifth node 378 of the second oscillator stage 302.

The twenty-second node 362 of the first oscillator stage 301 is coupled to the twenty-fifth node 376 of the second oscillator stage 302.

The twenty-fourth node 375 of the first oscillator stage 301 is coupled to the twenty-first node 364 of the second oscillator stage 302.

The twenty-fifth node 376 of the first oscillator stage 301 is coupled to the twenty-second node 365 of the second oscillator stage 302.

An oscillator stage 400 is explained below with reference to FIG. 4, which oscillator stage can be used in an injection-locked oscillator circuit having two oscillator stages and is to a very great extent identical to that illustrated in FIG. 3a. However, in FIG. 4 the capacitance is formed as a varactor coupled to tuning voltage source, which is also designated as Vtune in FIG. 4 and the subsequent Figures, the bulk terminals of a first and of a second transistor are coupled to a supply voltage source, supply voltage sources in FIG. 4 and also the subsequent Figures also being designated as Vdd, and the bulk terminals of a third and of a fourth transistor are coupled to a reference voltage source, reference voltage sources in FIG. 4 and also the subsequent Figures also being designated as Vss.

Figure 4:
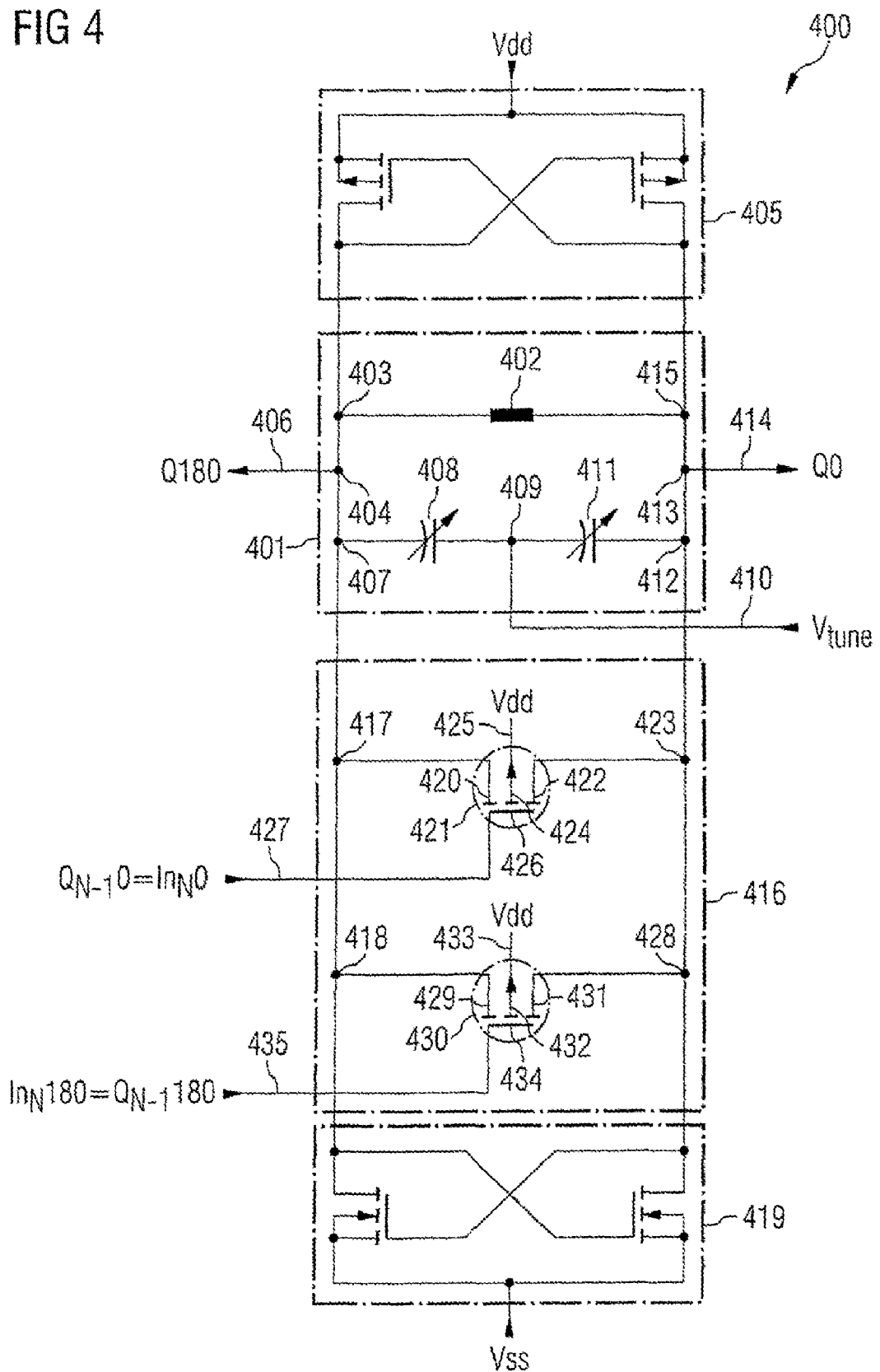
FIG. 4 illustrates a schematic illustration of an oscillator stage according to the invention which can be used in an injection-locked oscillator circuit comprising two oscillator stages.
Figure 5A:
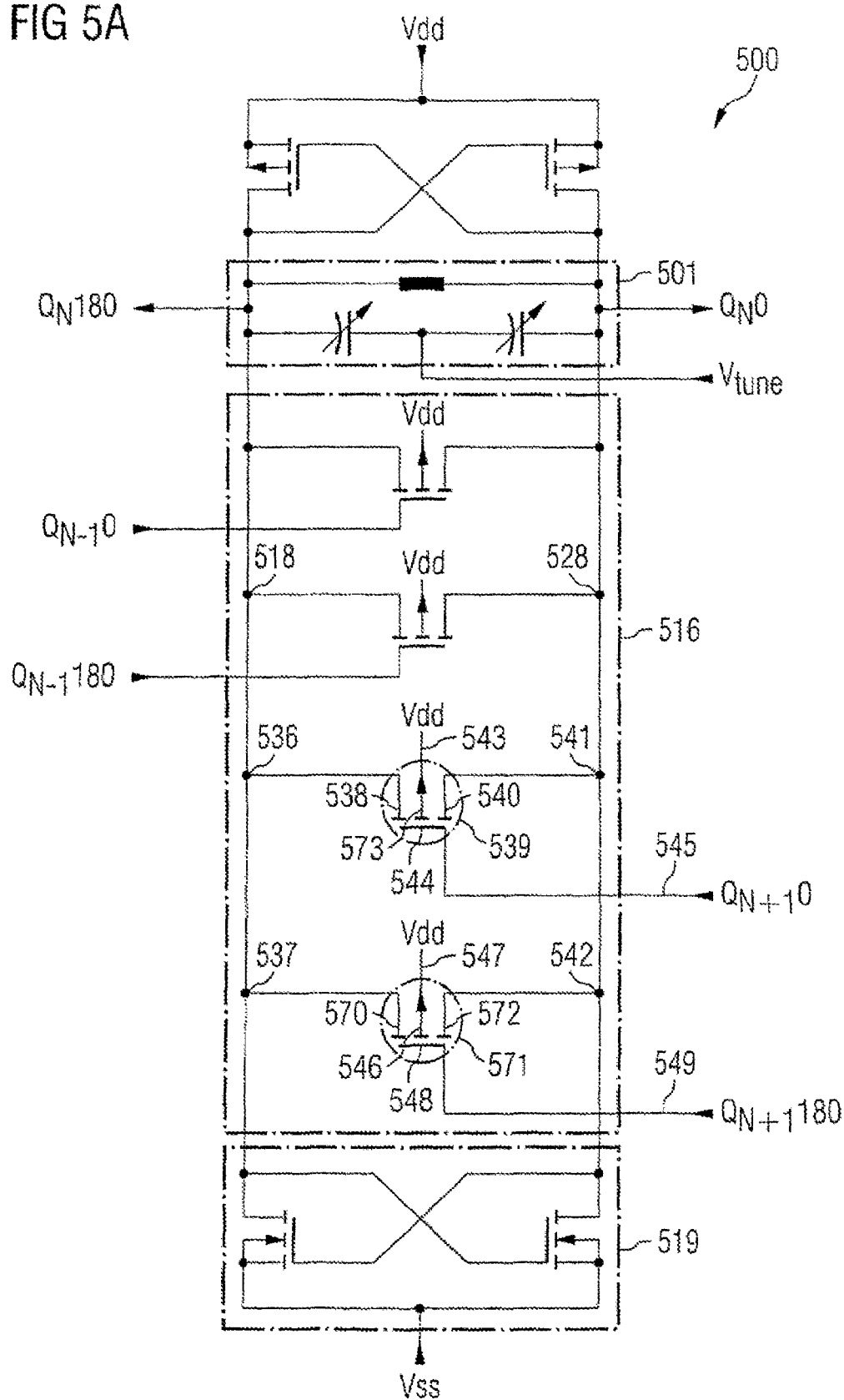
FIG. 5 illustrates schematic illustrations of two oscillator stages 5a and 5b according to the invention, which can be used in injection-locked oscillator circuits comprising four and six oscillator stages, respectively.
Figure 5B:
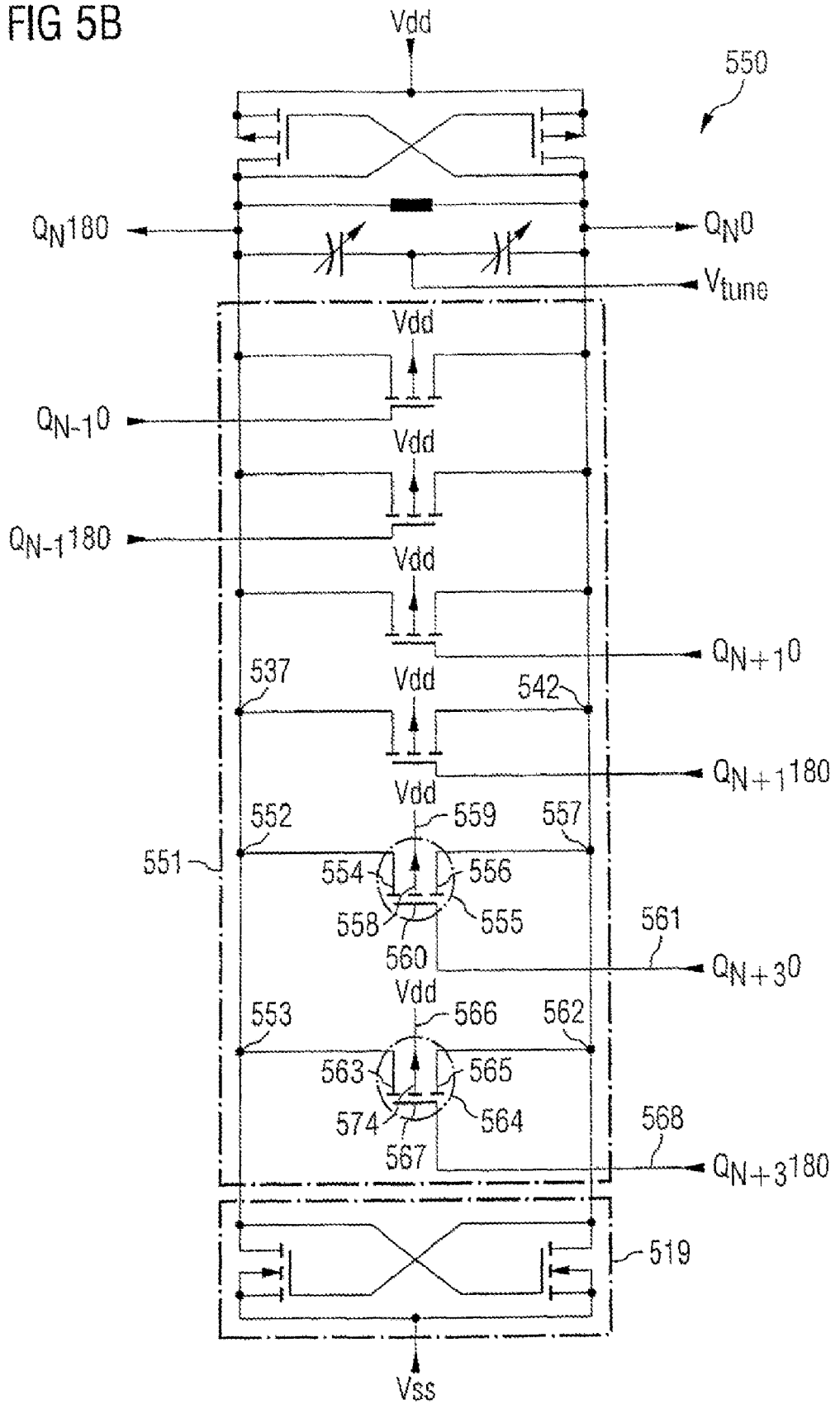

Since the subsequent FIGS. 5a and 5b are also to be explained with reference to FIG. 4, the LC element 401 and the coupling transistor subcircuit 416 are once again discussed in more detail.

The LC element 401 has an inductance 402, one terminal of which is coupled to a first node 403. The first node 403 is coupled to a second node 404. Furthermore, the first node 403 is coupled to a first oscillator transistor subcircuit 405, which is formed as in the exemplary embodiment of FIG. 3a. The second node 404 represents a first output terminal 406 of the oscillator stage. Furthermore, the second node 404 is coupled to a third node 407, which is coupled to a first terminal of a first varactor 408. The second terminal of the first varactor 408 is coupled to a fourth node 409, which is coupled to a tuning voltage source 410. The fourth node 409 is furthermore coupled to a first terminal of a second varactor 411. The second terminal of the second varactor 411 is coupled to a fifth node 412, which is coupled to a sixth node 413. The two varactors may also be formed as an individual varactor. The sixth node 413 represents a second output terminal 414 of the oscillator stage and is furthermore coupled to a seventh node 415. The seventh node 415 is coupled to the second terminal of the inductance 402. Furthermore, the seventh node 413 is coupled to the first oscillator transistor subcircuit 405.

The coupling transistor subcircuit 416 is described below. The third node 407 is coupled to an eighth node 417, which is coupled to a ninth node 418. The ninth node 418 is coupled to a second oscillator transistor subcircuit 419.

The eighth node 417 is coupled to a first source/drain terminal 420 of a first transistor 421. The second source/drain terminal 422 of the first transistor 421 is coupled to a tenth node 423. A bulk terminal 424 of the first transistor 421 is coupled to a supply voltage source 425. Supply voltage sources are additionally designated by Vdd in this Figure and the subsequent Figures. The gate terminal 426 of the first transistor 421 represents a first input terminal 427 of the oscillator stage. Input terminals are additionally designated by In0 and In180 in this Figure, where the 0 and 180 respectively refer to the relative phase angle. They are also designated by $Q_{n-1}$, $Q_{n+1}$ or $Q_{n+3}$ in the subsequent Figures, where the index n always refers to an n-th oscillator stage of the ILO circuit. The tenth node 423 is coupled to the fifth node 412 of the LC element 401. Furthermore, the tenth node 423 is coupled to an eleventh node 428. The eleventh node 428 is coupled to the second oscillator transistor subcircuit 419.

The ninth node 418 is coupled to a first source/drain terminal 429 of a second transistor 430. The second source/drain terminal 431 of the second transistor 430 is coupled to the eleventh node 428. A bulk terminal 432 of the second transistor 430 is coupled to a supply voltage source 433. The gate terminal 434 of the second transistor 430 represents a second input terminal 435 of the oscillator stage.

The voltages made available by the supply voltage sources 425 and 433 are identical. The signals present at the first output terminal 406 and at the second output terminal 414 are shifted in terms of their phase angle by 180° with respect to one another. Signals which have such a phase angle are also referred to as differential with respect to one another.

In a coupling of two of the oscillator stages just described to form an ILO circuit, the first output terminal 406 of the first oscillator stage is coupled to the second input terminal 435 of the second oscillator stage and the second output terminal 414 of the first oscillator stage is coupled to the first input terminal 427 of the second oscillator stage. Furthermore, the first output terminal 406 of the second oscillator stage is coupled to the first input terminal 427 of the first oscillator stage and the second output terminal 414 of the second oscillator stage is coupled to the first input terminal 435 of the second oscillator stage.

The coupling of the bulk terminals as explained above is to be regarded only by way of example in this case. According to one embodiment of the invention, the bulk terminals of the transistors may be coupled not only to a supply voltage but, for example, also to a center potential, a reference voltage source, to ground, in floating fashion and/or to the source terminal.

An oscillator stage which is suitable for an ILO circuit having four oscillator stages and, respectively, for an ILO circuit having six oscillator stages is explained below with reference to FIGS. 5 and 5b.

The oscillator stage 500 illustrated in FIG. 5a differs from the oscillator stage 400 illustrated in FIG. 4 only by the number of transistors present in the coupling transistor subcircuit. According to the invention, an oscillator stage which is intended to be used in an oscillator ring having four oscillator stages has four coupling transistors and thus also four input terminals. The two additional transistors are coupled in between a ninth node 518 and a second oscillator transistor subcircuit 519 and an eleventh node 528 and the second oscillator transistor subcircuit 519.

The coupling transistor subcircuit 516 of the oscillator stage 500 as illustrated in FIG. 5a is described in more detail below for elucidation purposes. The ninth node 518 is coupled to a twelfth node 536, which is coupled to a thirteenth node 537. The thirteenth node 537 is coupled to the second oscillator transistor subcircuit 519.

The twelfth node 536 is coupled to a first source/drain terminal 538 of a third transistor 539. The second source/drain terminal 540 of the third transistor 539 is coupled to a fourteenth node 541. A bulk terminal 573 of the third transistor 539 is coupled to a supply voltage source 543. The gate terminal 544 of the third transistor 539 represents a third input terminal 545 of the oscillator stage. The fourteenth node 541 is coupled to an eleventh node 528. Furthermore, the fourteenth node 541 is coupled to a fifteenth node 542. The fifteenth node 542 is coupled to the second oscillator transistor subcircuit 519.

The thirteenth node 537 is coupled to a first source/drain terminal 570 of a fourth transistor 571. The second source/drain terminal 572 of the fourth transistor 571 is coupled to the fifteenth node 542. A bulk terminal 546 of the fourth transistor 571 is coupled to a supply voltage source 547. The gate terminal 548 of the fourth transistor 571 represents a fourth input terminal 549 of the oscillator stage.

The precise coupling of the individual oscillator stages is discussed in more detail below with reference to FIG. 6.

The oscillator stage 550 illustrated in FIG. 5b differs from the oscillator stage 500 illustrated in FIG. 5a only by the number of transistors present in the coupling transistor subcircuit. According to one embodiment of the invention, an oscillator stage which is intended to be used in an ILO circuit having six oscillator stages has six coupling transistors and thus also six input terminals. The two additional transistors are coupled in between the thirteenth node 537 and the second oscillator transistor subcircuit 519 and the fifteenth node 542 and the second oscillator transistor subcircuit 519.

The coupling transistor subcircuit 551 of the oscillator stage 550 as illustrated in FIG. 5b is described in more detail below for elucidation purposes. The thirteenth node 537 is coupled to a sixteenth node 552, which is coupled to a seventeenth node 553. The seventeenth node 553 is coupled to the second oscillator transistor subcircuit 519.

The sixteenth node 552 is coupled to a first source/drain terminal 554 of a fifth transistor 555. The second source/drain terminal 556 of the fifth transistor 555 is coupled to an eighteenth node 557. A bulk terminal 558 of the fifth transistor 555 is coupled to a supply voltage source 559. The gate terminal 560 of the fifth transistor 555 represents a fifth input terminal 561 of the oscillator stage. The eighteenth node 557 is coupled to the fifteenth node 542. Furthermore, the eighteenth node 557 is coupled to a nineteenth node 562. The nineteenth node 562 is coupled to the second oscillator transistor subcircuit 519.

The seventeenth node 553 is coupled to a first source/drain terminal 563 of a sixth transistor 564. The second source/drain terminal 565 of the sixth transistor 564 is coupled to the nineteenth node 562. A bulk terminal 574 of the sixth transistor 564 is coupled to a supply voltage source 566. The gate terminal 567 of the sixth transistor 564 represents a sixth input terminal 568 of the oscillator stage 550.

The precise coupling of the individual oscillator stages illustrated in FIGS. 5a and 5b is explained below with reference to FIG. 6.

Figure 6:
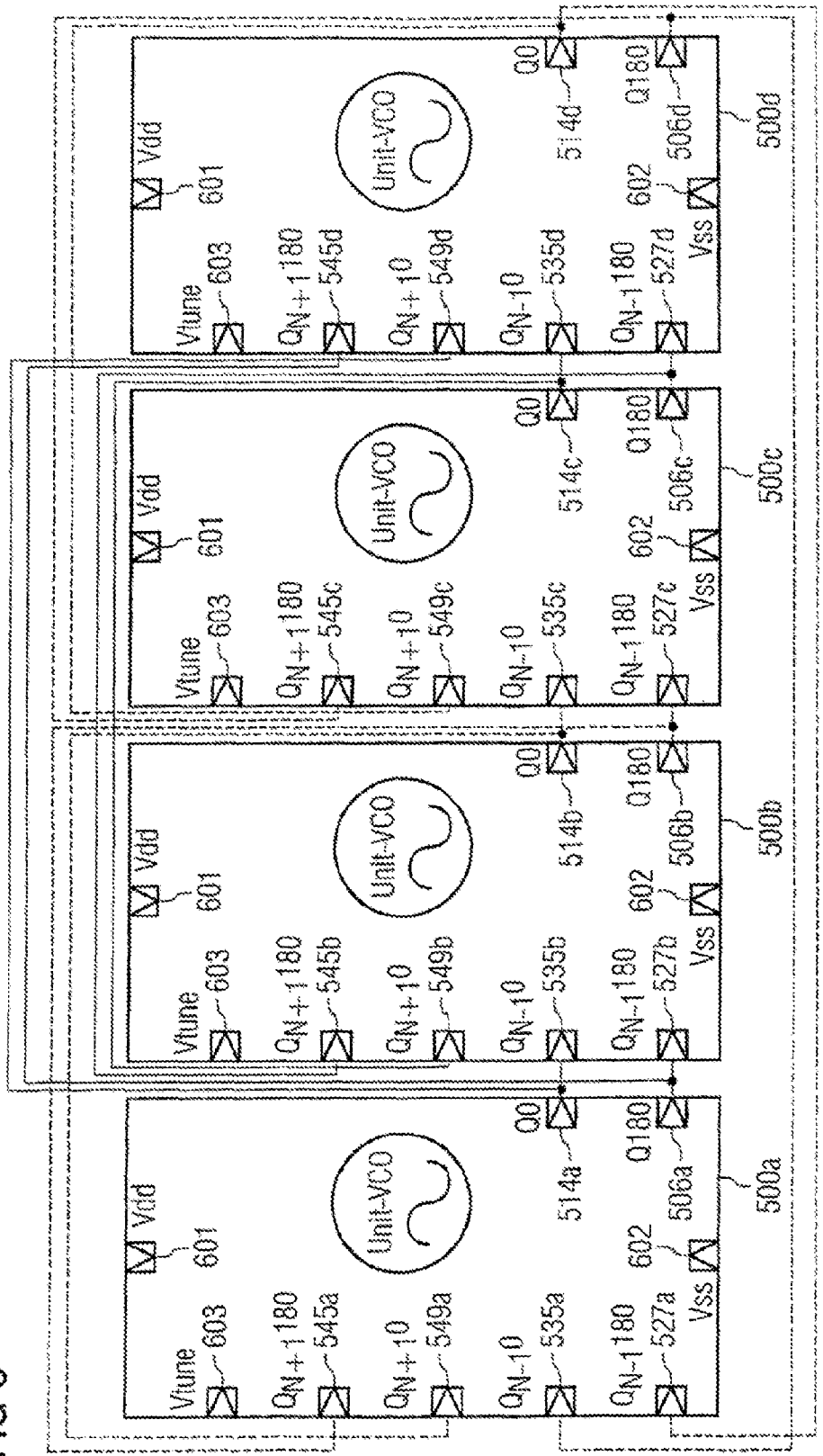
FIG. 6 illustrates a schematic illustration of the coupling of four oscillator stages to form an injection-locked oscillator circuit comprising four oscillator stages.
Figure 11:
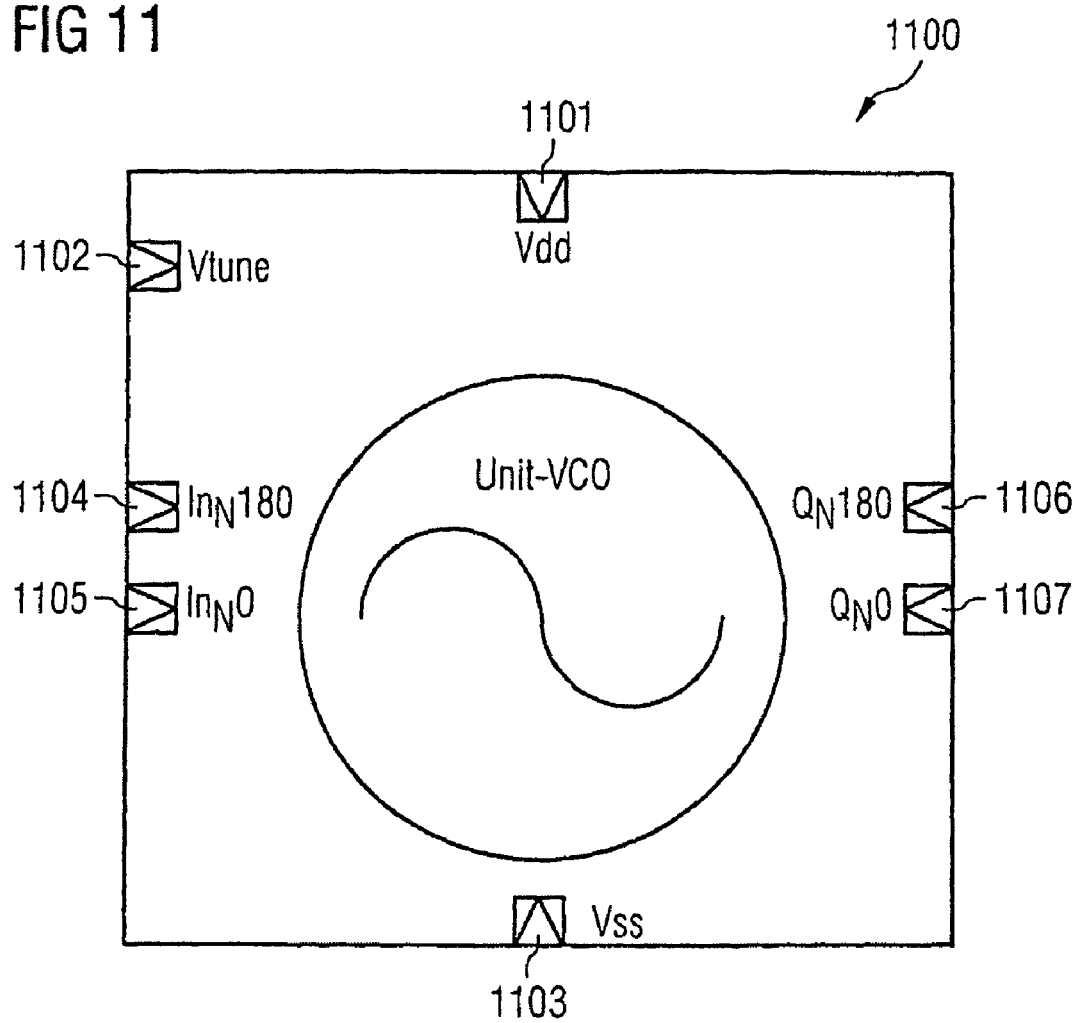
FIG. 11 illustrates a symbolic illustration of an oscillator stage in accordance with the prior art.

FIG. 6 schematically illustrates four oscillator stages 500a, 500b, 500c and 500d in the same schematic illustration as in FIG. 11. The oscillator stages in this case correspond to oscillator stages as are illustrated in FIG. 5a. The four oscillator stages are coupled to one another.

The schematic illustration of coupled oscillator stages is described in detail below. A first output terminal 506a of a first oscillator stage 500a, which for example provides a signal having a phase angle of 180°, is coupled to a first input terminal 527b of a second oscillator stage 500b, which input terminal has a phase angle of 180°. A second output terminal 514a of the first oscillator stage 500a, which in the example provides a signal having a phase angle of 0°, is coupled to a second input terminal 535b of the second oscillator stage 500b, which input terminal has a phase angle of 0°. Furthermore, the first output terminal 506a of the first oscillator stage 500a is coupled to a third input terminal 545d of a fourth oscillator stage 500d. The second output terminal 514a of the first oscillator stage 500a is furthermore coupled to a fourth input terminal 549d of the fourth oscillator stage 500d.

A first output terminal 506b of the second oscillator stage 500b, which for example provides a signal having a phase angle of 180°, is coupled to a first input terminal 527c of a third oscillator stage 500c, which input terminal has a phase angle of 180°. A second output terminal 514b of the second oscillator stage 500b, which in the example provides a signal having a phase angle of 0°, is coupled to a second input terminal 535c of the third oscillator stage 500c, which input terminal has a phase angle of 0°. Furthermore, the first output terminal 506b of the second oscillator stage 500b is coupled to a third input terminal 545a of the first oscillator stage 500a. The second output terminal 514b of the second oscillator stage 500b is furthermore coupled to a fourth input terminal 549a of the first oscillator stage 500a.

A first output terminal 506c of the third oscillator stage 500c, which for example provides a signal having a phase angle of 180°, is coupled to a first input terminal 527d of a fourth oscillator stage 500d, which input terminal has a phase angle of 180°. A second output terminal 514c of the third oscillator stage 500c, which in the example provides a signal having a phase angle of 0°, is coupled to a second input terminal 535d of the fourth oscillator stage 500d, which input terminal has a phase angle of 0°. Furthermore, the first output terminal 506c of the third oscillator stage 500c is coupled to a third input terminal 545b of the second oscillator stage 500b. The second output terminal 514c of the third oscillator stage 500c is furthermore coupled to a fourth input terminal 549b of the second oscillator stage 500b.

A first output terminal 506d of the fourth oscillator stage 500d, which for example provides a signal having a phase angle of 180°, is coupled to a first input terminal 527a of a first oscillator stage 500a, which input terminal has a phase angle of 180°. A second output terminal 514d of the fourth oscillator stage 500d, which in the example provides a signal having a phase angle of 0°, is coupled to a second input terminal 535a of the first oscillator stage 500a, which input terminal has a phase angle of 0°. Furthermore, the first output terminal 506d of the fourth oscillator stage 500d is coupled to a third input terminal 545c of the third oscillator stage 500c. The second output terminal 514d of the fourth oscillator stage 500d is furthermore coupled to a fourth input terminal 549c of the third oscillator stage 500c.

The coupling according to one embodiment of the invention of four oscillator stages according to the invention to form an ILO circuit or else oscillator ring has thus been completely described. In addition, the individual oscillator stages are also coupled to a supply voltage source by means of a supply terminal 601, to a reference voltage source by means of a reference voltage terminal 602 and to a tuning voltage source by means of a tuning voltage terminal 603.

When coupling oscillator stages to form an ILO circuit in a manner according to one embodiment of the invention, as many oscillator stages as desired can be coupled to one another. In one example, however, an even number of oscillator stages are coupled to one another to form an ILO circuit. In that case, the oscillator stages have precisely the same number of input terminals as the number of oscillator stages coupled to one another in the ILO circuit. That is to say that if six oscillator stages are coupled, each of the six oscillator stages has six input terminals. The six individual identically constructed oscillator stages are then coupled in such a way that the input terminals of the first oscillator stage are coupled to the output terminals of the second, of the fourth and of the sixth oscillator stage, that is to say to the output terminals of every second oscillator stage. It can generally be stated that in the case of an oscillator ring having k oscillator stages, the input terminals of the n-th oscillator stage are coupled to the output terminals of all mod(n+x;k) oscillator stages, where x runs through all odd numbers from 1 to k, or expressed mathematically x={x|mod(x+1;2)=0}, where "mod" represents the modulo function.

The number of oscillator stages is in one example restricted to an even number of oscillator stages, which results from the phase difference between two successive stages. The phase difference is fixed at ±90°. A clear explanation can be given for this. The explanation is given for an ILO circuit comprising two oscillator stages, for the sake of simplicity, but generally holds true for an even number of oscillator stages.

The gate voltages of the coupling transistors of the second oscillator stage, that is to say of the input terminals of the second oscillator stage, are given by the output signals which are phase-shifted by 180° with respect to one another and which are present at the output terminals of the first oscillator stage. If one of the output signals of the first oscillator stage, which is then equal to the gate voltage of the corresponding coupling transistor, is at a minimum value, then the gate voltage of the coupling transistor which is coupled to the second output signal—phase-shifted by 180°—of the first oscillator stage is maximal. Consequently, one of the two coupling transistors of the second stage is turned on to a great extent and the two output nodes, that is to say output terminals, of the second oscillator stage are brought to the same voltage, that is to say that this results in a zero crossing of the output signals of the second oscillator stage. Consequently, the zero crossings of the output signals of the second oscillator stage coincide with the maximum/minimum values of the first oscillator stage. It holds true for the first stage, however, that the minimum/maximum values and the zero crossings in the output signals are phase-shifted a quarter of a period, that is to say 90°. Consequently, the zero crossings of the first and second oscillator stages, or expressed generally of two successive oscillator stages, are shifted by ±90°.

From what has just been stated it also follows directly that only an even number of oscillator stages is possible since otherwise the requirement for a phase rotation which is a multiple of $2\pi$ cannot be met. This is, however, a condition which is to be met for every oscillator ring.

A synchronization of the zero crossings of an oscillator stage with the minima/maxima of the preceding or succeeding stage is thus effected by means of the coupling described with reference to FIG. 6. This synchronization provides for reducing temporal variations in the zero crossings, which is tantamount to reduced phase noise.

With the use of more than two oscillator stages within an ILO circuit, the synchronization can be intensified and the phase noise can thus be additionally reduced. Thus, in the case of an ILO circuit comprising four oscillator stages, each oscillator stage is synchronized both with the succeeding and with the preceding oscillator stage.

PMOS transistors were in one example used for the coupling transistors in the realization under consideration because PMOS transistors have a lower so-called "flicker noise" than NMOS transistors. In principle, it is also possible to carry out the coupling with only one transistor per feedback stage, whereby the ILO circuit is simplified. It is also possible to replace a switching element by a transfer element, or to use only NMOS transistors.

Figure 12:
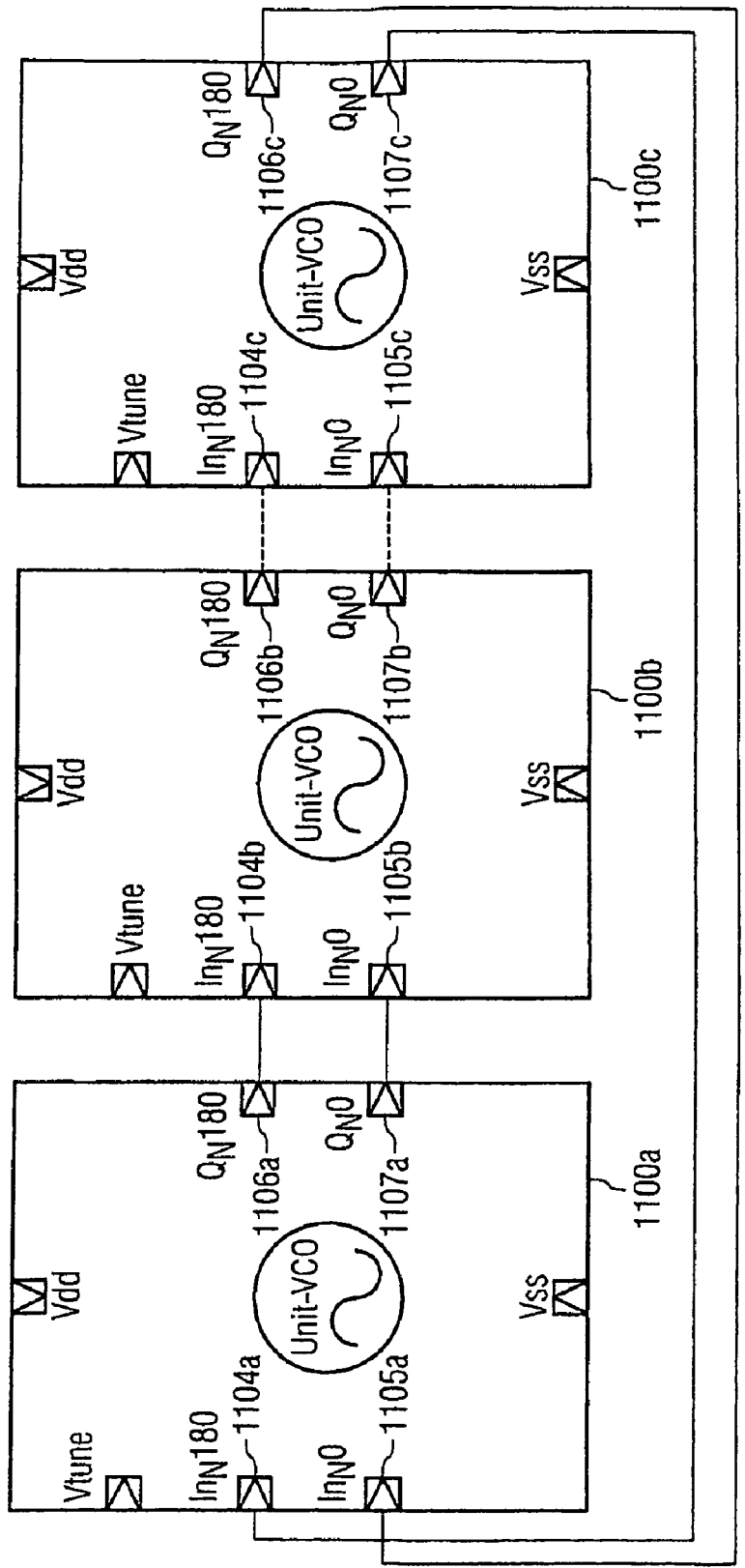
FIG. 12 illustrates a schematic illustration of the coupling of a plurality of oscillator stages in accordance with the prior art.
Figure 13:
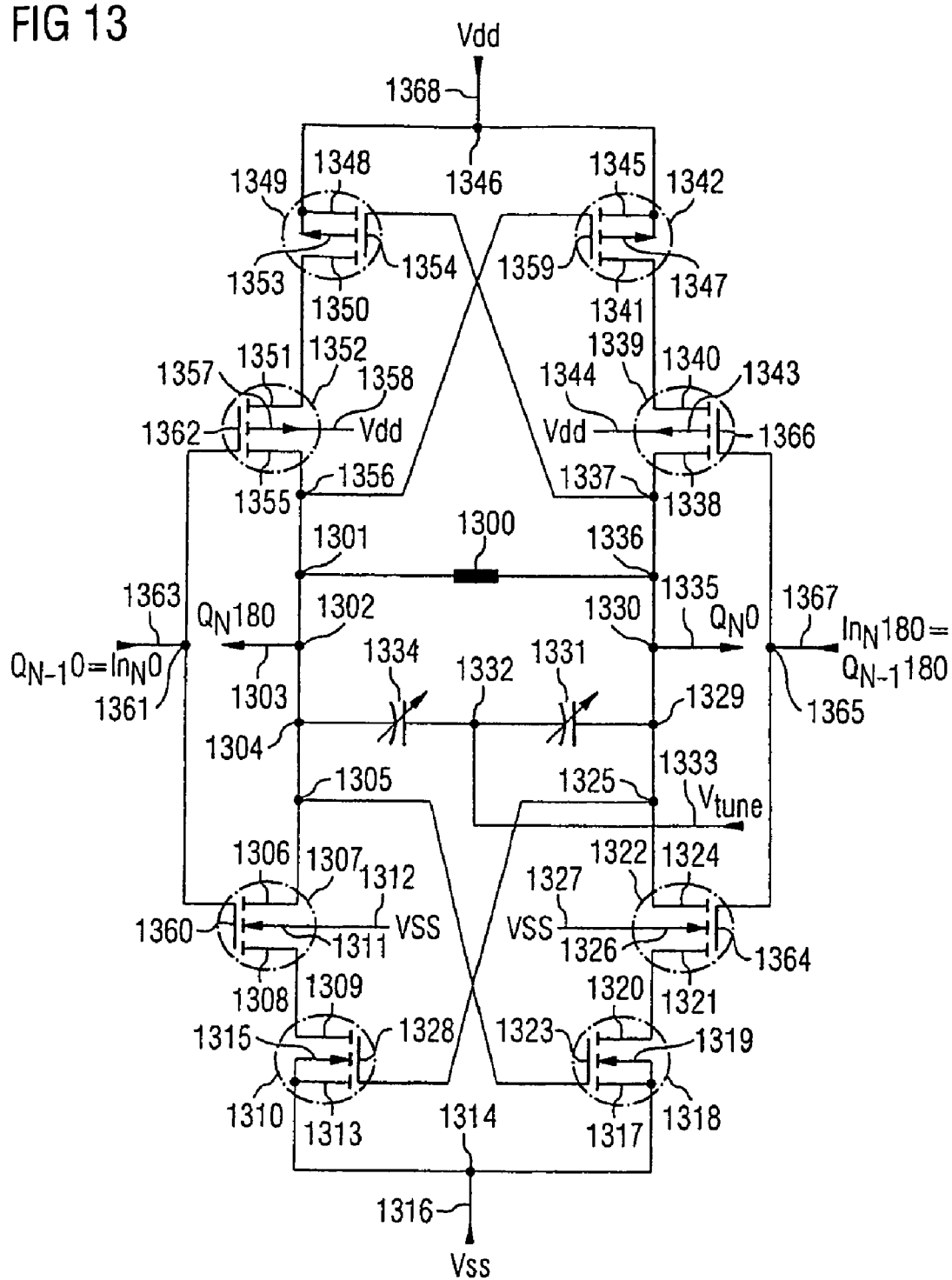
FIG. 13 illustrates a schematic illustration of an oscillator stage for a serial coupling in accordance with the prior art.
Figure 14:
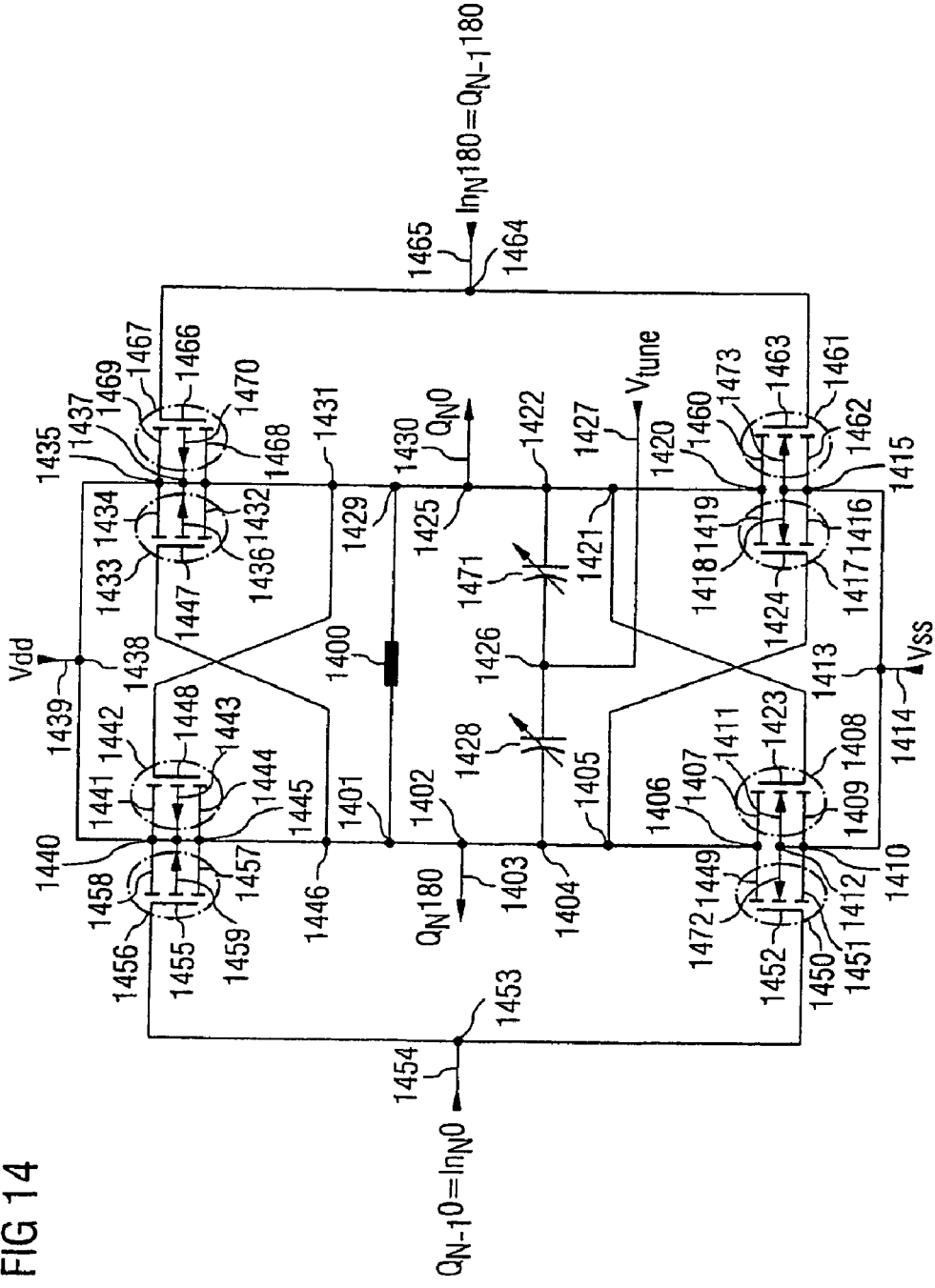
FIG. 14 illustrates a schematic illustration of an oscillator stage for a parallel coupling in accordance with the prior art.

In one case, the advantage over the solutions according to the prior art, namely a reduction of the phase noise in comparison with single-stage oscillators with the same basic cell, but without coupling transistors according to one embodiment of the invention, will become evident below with reference to FIGS. 7 and 8, which illustrate results of simulations. Starting from a use of four oscillator stages, distinct advantages in terms of the phase noise, that is to say lower phase noise, can be obtained compared with the parallel coupling described with reference to FIGS. 12 and 14. In accordance with the prior art, the parallel coupling is the coupling which causes the least phase noise. The simulation and also the design with regard to the various VCO concepts were carried out from the standpoint of meeting GSM frequency specifications and achieving the lowest possible phase noise within the frequency limits of GSM applications. All frequency bands from 850 MHz to 1.90 GHz are of interest in this case. A frequency divider (:2 and :4, respectively) following the VCO is planned, that is to say that a frequency tuning from 3 GHz to 4.3 GHz is required.

FIG. 7 illustrates the results of simulations for a basic cell, that is to say an individual oscillator stage, for an ILO circuit having a coupling according to the invention of two oscillator stages according to one embodiment of the invention and for an ILO circuit having a coupling according to the invention of four oscillator stages according to one embodiment of the invention for three different offset frequencies.

Figure 7A:
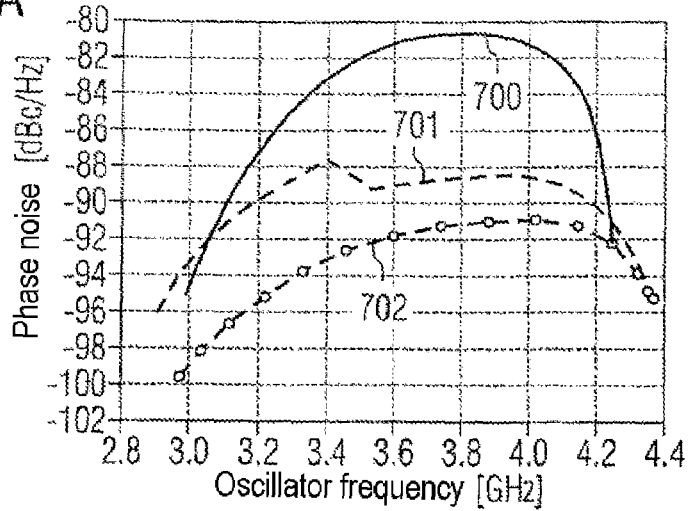
FIG. 7 illustrates results of a simulation calculation regarding phase noise of injection-locked oscillator circuits.

FIG. 7a illustrates the phase noise in dBc/Hz, where dBc denotes "dB with respect to carrier power", as a function of the oscillator frequency for an offset frequency of 100 kHz. In FIG. 7a, a first curve 700 represents the profile of the phase noise for a basic stage, that is to say an individual oscillator stage. A second curve 701 represents the profile of the phase noise for an ILO circuit having two oscillator stages, whereas a third curve 702 represents the profile for an ILO circuit having four oscillator stages.

It can be seen that the phase noise decreases as the number of oscillator stages per ILO circuit increases. In the—in FIG. 7a—central frequency range of approximately 3.7 GHz, the phase noise decreases by approximately 10 dBc/Hz.

Figure 7B:
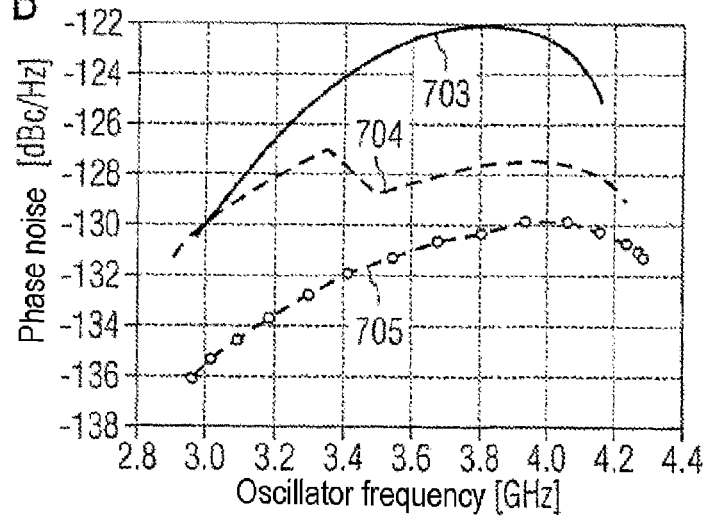

FIG. 7b illustrates the phase noise in dBc/Hz as a function of the oscillator frequency for an offset frequency of 3 MHz. In FIG. 7b, a first curve 703 represents the profile of the phase noise for a basic stage, that is to say an individual oscillator stage. A second curve 704 represents the profile of the phase noise for an ILO circuit having two oscillator stages, whereas a third curve 705 represents the profile for an ILO circuit having four oscillator stages.

It can be seen in this case, too, that the phase noise decreases as the number of oscillator stages per ILO circuit increases. At a frequency of approximately 3.9 GHz, the phase noise decreases by approximately 9 dBc/Hz. It should additionally be noted that the phase noise turns out to be lower at an offset frequency of 3 MHz than at an offset frequency of 100 kHz.

Figure 7C:
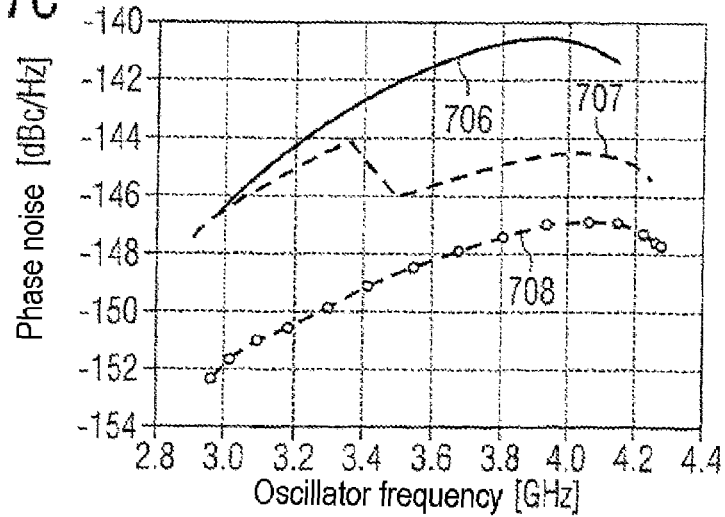

FIG. 7c illustrates the phase noise in dBc/Hz as a function of the oscillator frequency for an offset frequency of 20 MHz. In FIG. 7c, a first curve 706 represents the profile of the phase noise for a basic stage, that is to say an individual oscillator stage. A second curve 707 represents the profile of the phase noise for an ILO circuit having two oscillator stages, whereas a third curve 708 represents the profile for an ILO circuit having four oscillator stages.

It can be seen in this case, too, that the phase noise decreases as the number of oscillator stages per ILO circuit increases. In the frequency range of approximately 4.0 GHz, the phase noise decreases by approximately 8 dBc/Hz. It should additionally be noted that the phase noise once again turns out to be lower at an offset frequency of 20 MHz than at an offset frequency of 3 MHz.

In FIG. 8, the results of simulations for an oscillator ring in accordance with the prior art comprising four oscillator stages coupled in parallel are compared with the results of simulations for an ILO circuit according to one embodiment of the invention comprising four oscillator stages for three different offset frequencies.

Figure 8A:
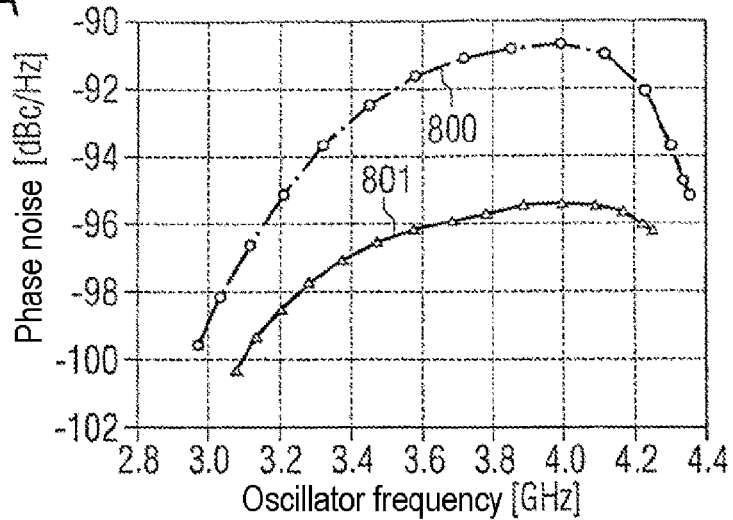
FIG. 8 illustrates results of a simulation calculation regarding phase noise of injection-locked oscillator circuits.

FIG. 8a illustrates the phase noise in dBc/Hz as a function of the oscillator frequency for an offset frequency of 100 kHz. In FIG. 8a, a first curve 800 represents the profile of the phase noise for an oscillator ring in accordance with the prior art having four oscillator stages coupled in parallel, whereas a second curve 801 represents the profile for an ILO circuit according to the invention having four oscillator stages.

It can be seen that the phase noise of an ILO circuit according to one embodiment of the invention is significantly lower than the phase noise of an oscillator ring in accordance with the prior art. In the frequency range illustrated, the improvement by the ILO circuit according to the invention is approximately 3 to 5 dBc/Hz.

Figure 8B:
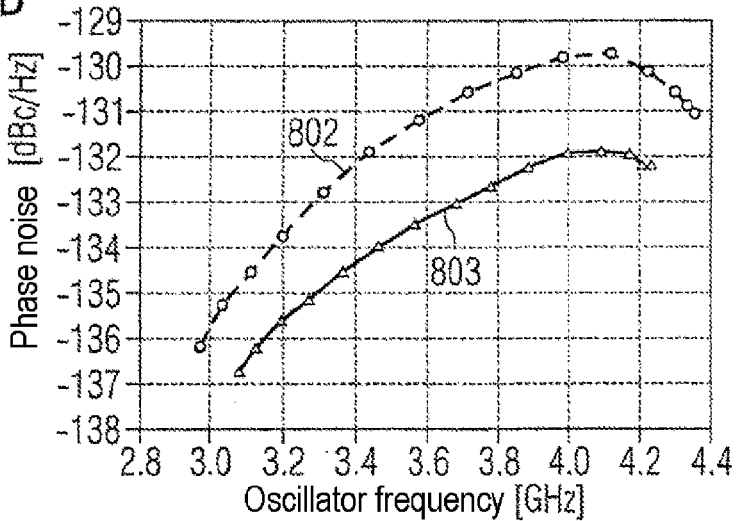

FIG. 8b illustrates the phase noise in dBc/Hz as a function of the oscillator frequency for an offset frequency of 3 MHz. In FIG. 8b, a first curve 802 represents the profile of the phase noise for an oscillator ring in accordance with the prior art having four oscillator stages coupled in parallel, whereas a second curve 803 represents the profile for an ILO circuit according to the invention having four oscillator stages.

It can be seen that the phase noise of an ILO circuit according to one embodiment of the invention is significantly lower than the phase noise of an oscillator ring in accordance with the prior art. In the frequency range illustrated, the improvement by the ILO circuit according to one embodiment of the invention is approximately 2 to 3 dBc/Hz.

Figure 8C:
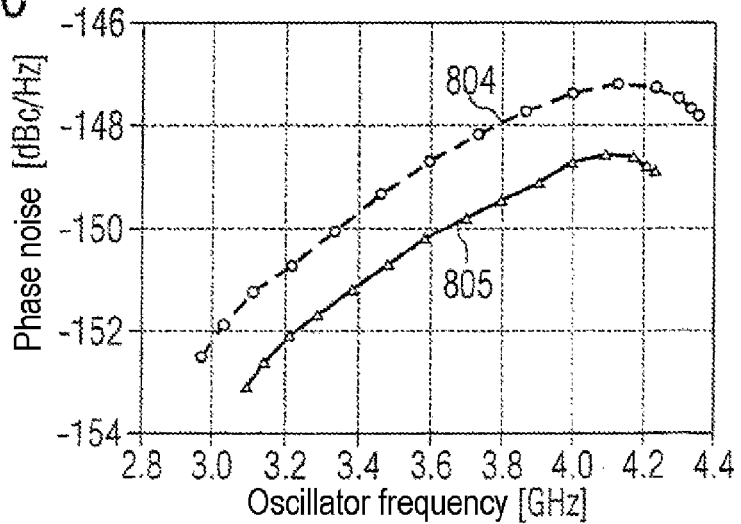

FIG. 8c illustrates the phase noise in dBc/Hz as a function of the oscillator frequency for an offset frequency of 20 MHz. In FIG. 8c, a first curve 804 represents the profile of the phase noise for an oscillator ring in accordance with the prior art having four oscillator stages coupled in parallel, whereas a second curve 805 represents the profile for an ILO circuit according to one embodiment of the invention having four oscillator stages.

It can be seen that the phase noise of an ILO circuit according to one embodiment of the invention is significantly lower than the phase noise of an oscillator ring in accordance with the prior art. In the frequency range illustrated, the improvement by the ILO circuit according to one embodiment of the invention is approximately 2 dBc/Hz.

In addition to the coupling—described with reference to FIG. 6—of an even number of oscillator stages to form an ILO circuit according to one embodiment of the invention, a description is given below with reference to FIG. 9, of a coupling of an odd number of oscillator stages to form an ILO circuit.

The individual oscillator stages of the ILO circuit differ in the case of an ILO circuit having an odd number of oscillator stages. The coupling of an ILO circuit comprising three oscillator stages 400a, 500b and 400c is explained with reference to FIG. 9. Two oscillator stages 400a and 400c with two coupling transistors such as correspond to the oscillator stage illustrated in FIG. 4 and an oscillator stage 500b with four coupling transistors such as correspond to the oscillator stage illustrated in FIG. 5a are formed in this case.

Figure 9:
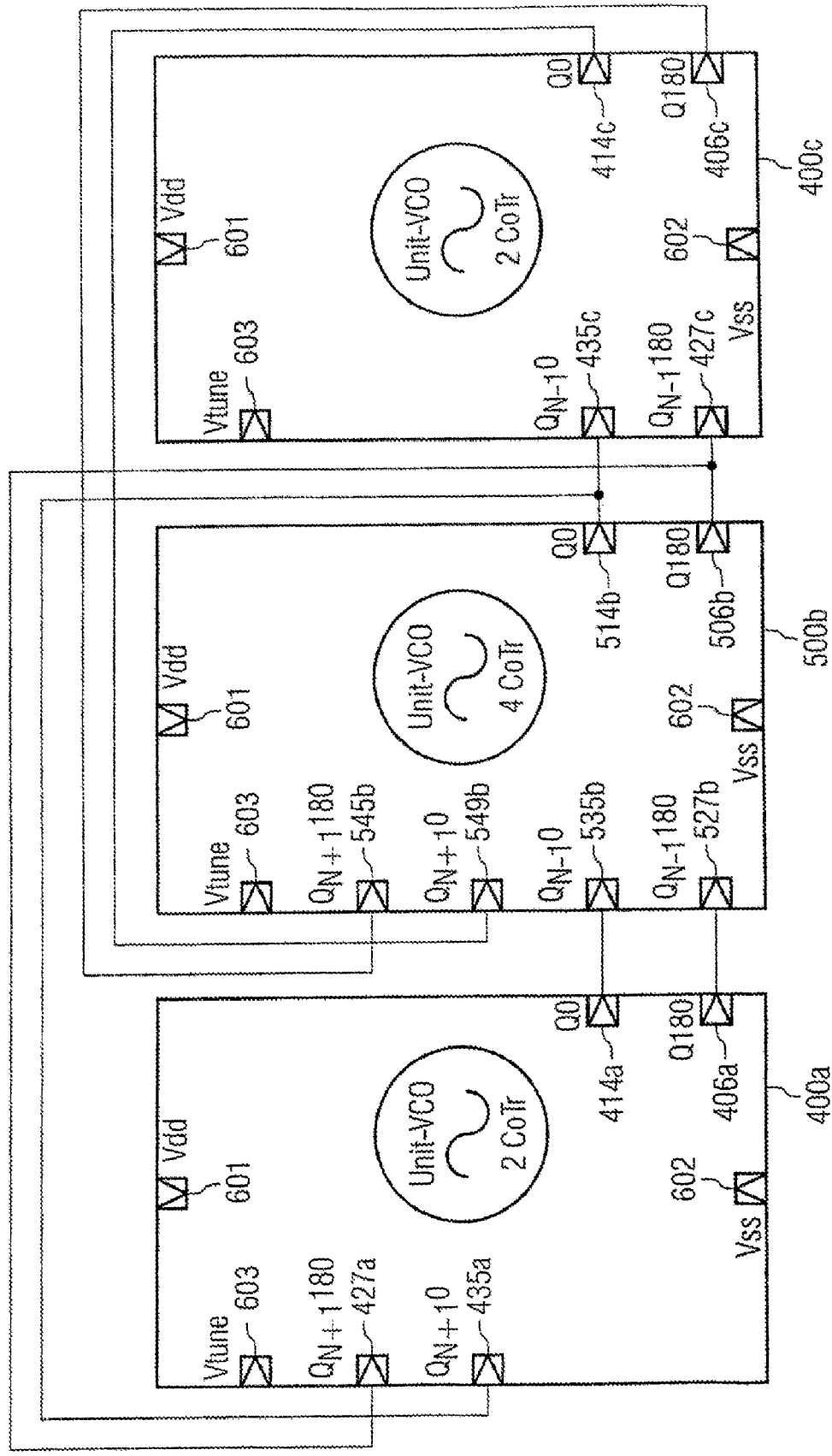
FIG. 9 illustrates a schematic illustration of the coupling of three oscillator stages to form an injection-locked oscillator circuit comprising an odd number of oscillator stages.
Figure 10:
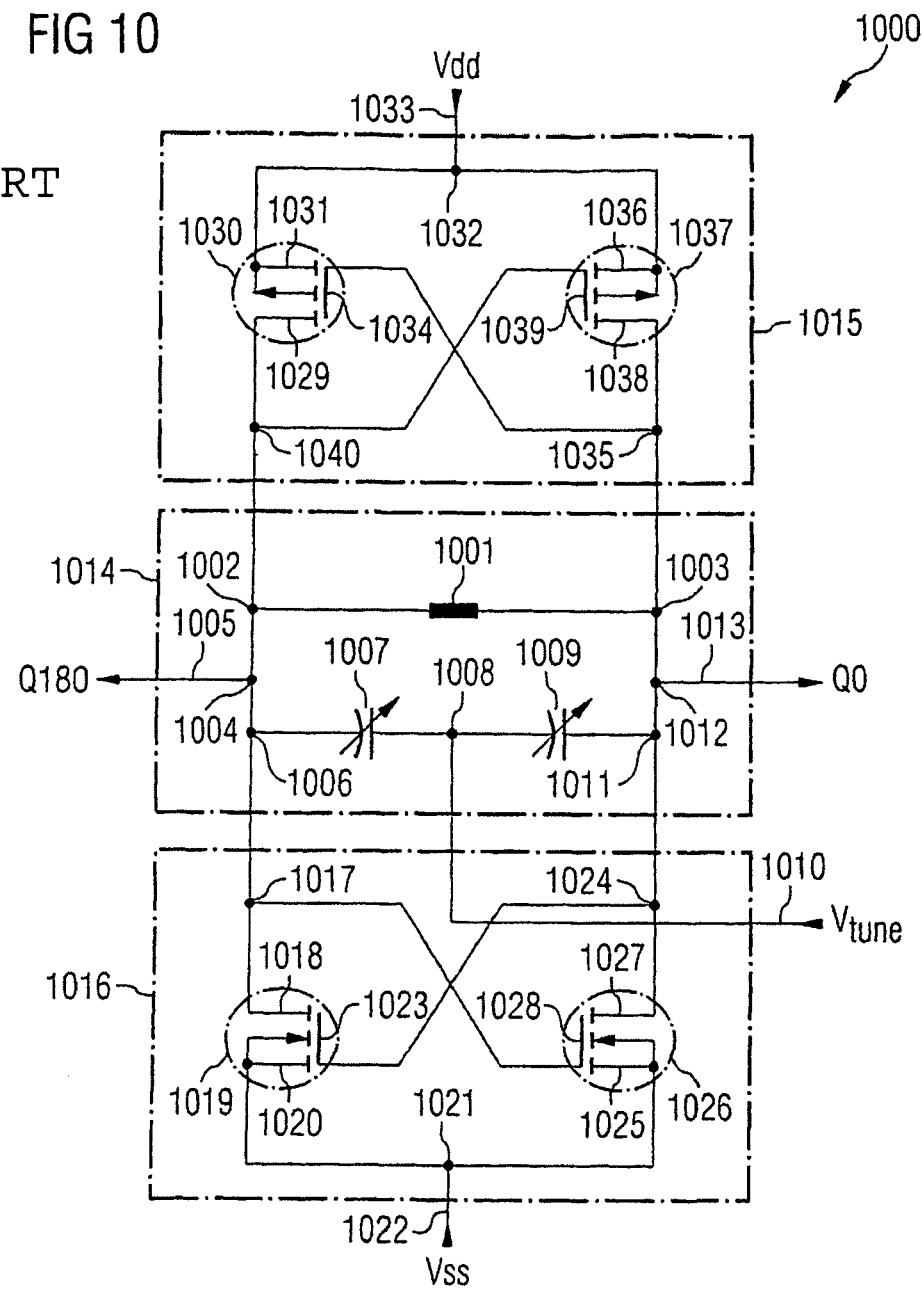
FIG. 10 illustrates a schematic illustration of a differential oscillator in accordance with the prior art.

FIG. 9 schematically illustrates three oscillator stages 400a, 500b and 400c, the oscillator stages being illustrated in the same schematic illustration as in FIGS. 6 and 11. The three oscillator stages are coupled to one another.

The schematic illustration of coupled oscillator stages is described in detail below. A first output terminal 406a of a first oscillator stage 400a, which for example provides a signal having a phase angle of 180°, is coupled to a first input terminal 527b of a second oscillator stage 500b, which input terminal has a phase angle of 180°. A second output terminal 414a of the first oscillator stage 400a, which in the example provides a signal having a phase angle of 0°, is coupled to a second input terminal 535b of the second oscillator stage 500b, which input terminal has a phase angle of 0°.

A first output terminal 506b of the second oscillator stage 500b, which for example provides a signal having a phase angle of 180°, is coupled to a first input terminal 427c of a third oscillator stage 400c, which input terminal has a phase angle of 180°. A second output terminal 514b of the second oscillator stage 500b, which in the example provides a signal having a phase angle of 0°, is coupled to a second input terminal 435c of the third oscillator stage 400c, which input terminal has a phase angle of 0°. Furthermore, the first output terminal 506b of the second oscillator stage 500b is coupled to a first input terminal 427a of the first oscillator stage 400a. The second output terminal 514b of the second oscillator stage 500b is furthermore coupled to a second input terminal 435a of the first oscillator stage 400a.

A first output terminal 406c of the third oscillator stage 400c, which for example provides a signal having a phase angle of 180°, is coupled to a third input terminal 545b of the second oscillator stage 500b, which input terminal has a phase angle of 180°. A second output terminal 414c of the third oscillator stage 400c, which in the example provides a signal having a phase angle of 0°, is coupled to a fourth input terminal 549b of the second oscillator stage 500b, which input terminal has a phase angle of 0°.

In addition, the individual oscillator stages are also coupled to a supply voltage source by means of a supply voltage terminal 601, to a reference voltage source by means of a reference voltage terminal 602, and to a tuning voltage source by means of a tuning voltage terminal 603.

ILO circuits having an odd number of oscillator stages are not restricted to three oscillator stages. Any desired numbers of oscillator stages can be used. By way of example, an ILO circuit comprising five oscillator stages comprises three oscillator stages with four coupling transistors and thus four input terminals and two oscillator stages with six coupling transistors and thus six input terminals, the two "types" of oscillator stages being arranged alternately in the ILO circuit.

In this case, every n-th oscillator stage of k oscillator stages is coupled by its input terminals to the output terminals of the mod(n+x;k) oscillator stages, where x runs through all odd numbers from 1 to k, or expressed mathematically x={x|mod (x+1;2)=0}, where "mod" represents the modulo function. In this case, with an odd number of oscillator stages, however, it must be taken into account that no oscillator stage has a feedback with itself.

One embodiment of the invention provides an ILO circuit which has a plurality of oscillator stages which are coupled to one another by means of a "tank lock" coupling. The coupling according to one embodiment of the invention leads to an improved synchronization of the individual oscillator stages and thus to a reduced phase noise compared with an oscillator ring in accordance with the prior art. According to one embodiment of the invention, any desired LC oscillator topology can be used, not just the topology with PMOS and NMOS transistors shown here; by way of example, it is also possible to use SOI transistors, that is to say transistors formed on an SOI substrate. The coupling of the bulk terminals explained above is to be regarded only by way of example in this case. According to one embodiment of the invention, the bulk terminals of the transistors may be coupled not only to a supply voltage but e.g. also to a center potential, a reference voltage source, to ground, in floating fashion and/or to the source terminal.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An injection-locked oscillator circuit comprising at least two oscillator stages, each oscillator stage comprising:
    an inductance;
    a capacitance connected in parallel with the inductance;
    at least one output node;
    a coupling-switching element subcircuit comprising at least one coupling-switching element which is coupled in parallel with the inductance and the capacitance in such a way that in each case precisely one coupling-switching element is present serially; and
    at least one input terminal formed by means of the control terminal of the coupling-switching element;
    wherein the oscillator stages of the injection-locked oscillator circuit are coupled by means of the coupling-switching element subcircuits and configured such that the oscillator stages synchronize each other.

2. The injection-locked oscillator circuit of claim 1, wherein each oscillator stage has two output terminals at which signals that are differential with respect to one another are present.

3. The injection-locked oscillator circuit of claim 1, wherein the coupling-switching element subcircuit has two additional coupling-switching elements which are connected up to one another and are connected in parallel with the coupling-switching elements connected up to one another.

4. The injection-locked oscillator circuit of claim 1, wherein the coupling-switching elements are transistors.

5. The injection-locked oscillator circuit of claim 4 wherein the transistors are NMOS and/or PMOS transistors.

6. The injection-locked oscillator circuit of claim 5, wherein a respective one of the transistors connected in parallel is a PMOS transistor and the other transistor connected in parallel is an NMOS transistor.

7. The injection-locked oscillator circuit of claim 1, wherein the capacitances are formed by means of varactors.

8. The injection-locked oscillator circuit of claim 1, wherein the oscillator stages have an active element.

9. The injection-locked oscillator circuit of claim 1, wherein an even number of oscillator stages are coupled to form an injection-locked oscillator circuit.

10. The injection-locked oscillator circuit of claim 9, wherein the number of input terminals of each oscillator stage is equal to the number of oscillator stages of the injection-locked oscillator circuit.

11. The injection-locked oscillator circuit of claim 10, wherein the injection-locked oscillator circuit has four oscillator stages, each oscillator stage having four input terminals and two output terminals and two of the input terminals being coupled to the output terminals of a preceding oscillator stage of the injection-locked oscillator circuit in the signal flow direction, and the other two input terminals being coupled to the output terminals of the downstream injection-locked oscillator circuit in the signal flow direction.

12. The injection-locked oscillator circuit of claim 1, wherein the injection-locked oscillator circuit has an odd number of oscillator stages.

13. A semiconductor comprising:
    a first inductance coupled in parallel with a first capacitance;
    a first switching circuit coupled in parallel with the first inductance and capacitance, the first switching circuit having a control terminal configured as a first input;
    a second inductance coupled in parallel with a second capacitance;
    a second switching circuit coupled in parallel with the second inductance and capacitance, the second switching circuit having a control terminal configured as a second input; and
    means for coupling the first and second switching circuits to form an injection-locked oscillator circuit,
    wherein the first inductance, first capacitance and first switching circuit form a first oscillator stage and the second inductance, second capacitance and second switching circuit form a second oscillator stage, wherein each oscillator stage has two output terminals with differential signals, wherein the oscillator stages of the injection-locked oscillator circuit are coupled by means of the switching circuits such that the oscillator stages synchronize each other.

14. The circuit of claim 13, wherein the coupling-switching elements are transistors.

15. The circuit of claim 13, wherein the transistors are NMOS and/or PMOS transistors.

16. The circuit of claim 13, wherein a respective one of the transistors connected in parallel is a PMOS transistor and the other transistor connected in parallel is an NMOS transistor.

17. The circuit of claim 13, wherein the capacitances are formed by means of varactors.

18. The circuit of claim 13, wherein the oscillator stages have an active element.

19. The circuit of claim 13, wherein an even number of oscillator stages are coupled to form an injection-locked oscillator circuit.

* * * * *